United States Patent
Basel et al.

(10) Patent No.: US 10,917,038 B2
(45) Date of Patent: Feb. 9, 2021

(54) PNEUMATIC ACTUATOR SYSTEM AND METHOD

(71) Applicant: SUNFOLDING, INC., San Francisco, CA (US)

(72) Inventors: Louis Hong Basel, Berkeley, CA (US); Kyle Douglass Betts, San Francisco, CA (US); Alex Tan Kwan, San Gabriel, CA (US); Jeffrey Charles Lamb, San Francisco, CA (US); Erica S. C. Lin, Millbrae, CA (US); Leila Madrone, San Francisco, CA (US); James Vincent Nolan, IV, San Francisco, CA (US); Matthew N Schneider, Sierra Madre, CA (US); Youngjoo Shin, Chandler, AZ (US); Eric Preston Lien Suan, Baltimore, MD (US)

(73) Assignee: SUNFOLDING, INC., San Francisco, CA (US)

( * ) Notice: Subject to any disclaimer, the term of this patent is extended or adjusted under 35 U.S.C. 154(b) by 3 days.

(21) Appl. No.: 15/955,044

(22) Filed: Apr. 17, 2018

(65) Prior Publication Data
US 2018/0302025 A1    Oct. 18, 2018

Related U.S. Application Data

(60) Provisional application No. 62/486,369, filed on Apr. 17, 2017, provisional application No. 62/486,335, (Continued)

(51) Int. Cl.
*F15B 15/10* (2006.01)
*H02S 20/32* (2014.01)
(Continued)

(52) U.S. Cl.
CPC ............... *H02S 20/32* (2014.12); *B25J 9/142* (2013.01); *F15B 15/10* (2013.01); *F24S 30/425* (2018.05);
(Continued)

(58) Field of Classification Search
CPC ....... H01L 31/00–078; Y02E 10/50–60; H02S 20/00–32; F15B 15/10–17
(Continued)

(56) References Cited

U.S. PATENT DOCUMENTS

| 979,460 A | 12/1910 | Fulton |
| 2,920,656 A | 1/1960 | Bertolet |

(Continued)

FOREIGN PATENT DOCUMENTS

| CA | 2330612 A1 | 6/2002 |
| CN | 101783619 A | 7/2010 |

(Continued)

OTHER PUBLICATIONS

Author Unkown, http://www.utilityscalesolar.com/Utility_Scale_Solar,_Inc./USS_Homepage.html, Utility Scale Solar, Inc., 2011.
(Continued)

*Primary Examiner* — Bach T Dinh
(74) *Attorney, Agent, or Firm* — Davis Wright Tremaine LLP

(57) ABSTRACT

An actuator that includes a bottom plate, a top-plate, and a first and second hub assembly extending between the bottom and top plates. The actuator can further include a first and second bellows disposed on opposing sides of the hub assemblies, the first and second bellows each extending between and coupled to the top plate and bottom plate. The actuator can also include a plurality of washers disposed between the top and bottom plates, with each of the washers coupled to the first and second hub assembly, a first set of the
(Continued)

plurality of washers surrounding the first bellows and a second set of the plurality of washers surrounding the second bellows.

9 Claims, 32 Drawing Sheets

Related U.S. Application Data filed on Apr. 17, 2017, provisional application No. 62/486,377, filed on Apr. 17, 2017.

(51) Int. Cl.
| | | |
|---|---|---|
| *F24S 50/20* | (2018.01) | |
| *H01L 31/042* | (2014.01) | |
| *F24S 30/425* | (2018.01) | |
| *H02S 20/10* | (2014.01) | |
| *B25J 9/14* | (2006.01) | |
| *F24S 30/00* | (2018.01) | |
| *G01S 3/786* | (2006.01) | |

(52) U.S. Cl.
CPC ............ *F24S 50/20* (2018.05); *H01L 31/042* (2013.01); *H02S 20/10* (2014.12); *F15B 2211/6303* (2013.01); *F15B 2211/6309* (2013.01); *F15B 2211/7107* (2013.01); *F15B 2211/7656* (2013.01); *F15B 2211/8855* (2013.01); *F24S 2030/115* (2018.05); *F24S 2030/12* (2018.05); *G01S 3/7861* (2013.01); *Y02E 10/47* (2013.01); *Y02E 10/50* (2013.01)

(58) Field of Classification Search
USPC ........... 136/243–265; 92/34–47; 91/151–164
See application file for complete search history.

(56) References Cited

U.S. PATENT DOCUMENTS

| | | | |
|---|---|---|---|
| 3,284,964 | A | 11/1966 | Norio |
| 3,472,062 | A | 10/1969 | Owen |
| 3,602,047 | A | 8/1971 | Kistler |
| 3,800,398 | A | 4/1974 | Harrington, Jr. |
| 3,956,543 | A | 5/1976 | Stangeland |
| 3,982,526 | A | 9/1976 | Barak |
| 4,063,543 | A | 12/1977 | Hedger |
| 4,102,326 | A | 7/1978 | Sommer |
| 4,120,635 | A | 10/1978 | Langecker |
| 4,154,221 | A | 5/1979 | Nelson |
| 4,172,443 | A | 10/1979 | Sommer |
| 4,175,540 | A | 11/1979 | Roantree et al. |
| 4,185,615 | A | 1/1980 | Bottum |
| 4,198,954 | A | 4/1980 | Meijer |
| 4,345,582 | A | 8/1982 | Aharon |
| 4,424,802 | A | 1/1984 | Winders |
| 4,459,972 | A | 7/1984 | Moore |
| 4,464,980 | A | 8/1984 | Yoshida |
| 4,494,417 | A | 1/1985 | Larson et al. |
| 4,566,432 | A | 1/1986 | Sobczak et al. |
| 4,620,771 | A | 11/1986 | Dominguez |
| 4,751,868 | A | 6/1988 | Paynter |
| 4,768,871 | A | 9/1988 | Mittelhauser et al. |
| 4,777,868 | A * | 10/1988 | Larsson ................ F15B 15/103 92/42 |
| 4,784,042 | A * | 11/1988 | Paynter .................... B25J 9/142 414/7 |
| 4,832,001 | A | 5/1989 | Baer |
| 4,848,179 | A | 7/1989 | Ubhayakar |
| 4,900,218 | A | 2/1990 | Sutherland |
| 4,939,982 | A | 7/1990 | Immega et al. |
| 4,954,952 | A | 9/1990 | Ubhayakar et al. |
| 4,977,790 | A * | 12/1990 | Nishi ..................... B25J 18/06 74/490.04 |
| 5,021,798 | A | 6/1991 | Ubhayakar |
| 5,040,452 | A | 8/1991 | Van Kerkvoort |
| 5,080,000 | A | 1/1992 | Bubic et al. |
| 5,156,081 | A | 10/1992 | Suzumori |
| 5,181,452 | A | 1/1993 | Immega |
| 5,251,538 | A | 10/1993 | Smith |
| 5,317,952 | A | 6/1994 | Immega |
| 5,337,732 | A | 8/1994 | Grundfest et al. |
| 5,386,741 | A | 2/1995 | Rennex |
| 5,469,756 | A | 11/1995 | Feiten |
| 5,697,285 | A | 12/1997 | Nappi et al. |
| 5,816,769 | A | 10/1998 | Bauer et al. |
| 6,054,529 | A | 4/2000 | O'Donnell et al. |
| 6,080,927 | A | 6/2000 | Johnson |
| 6,178,872 | B1 | 1/2001 | Schulz |
| 6,557,804 | B1 | 5/2003 | Carroll |
| 6,772,673 | B2 | 8/2004 | Seto et al. |
| 6,875,170 | B2 | 4/2005 | Francois et al. |
| 7,331,273 | B2 | 2/2008 | Kerekes et al. |
| 7,531,741 | B1 | 5/2009 | Melton et al. |
| 7,614,615 | B2 | 11/2009 | Egolf |
| 8,201,473 | B2 | 6/2012 | Knoll |
| 8,305,736 | B2 | 11/2012 | Yee et al. |
| 8,657,271 | B2 | 2/2014 | Szekely et al. |
| 8,700,215 | B2 | 4/2014 | Komatsu et al. |
| 8,863,608 | B2 | 10/2014 | Fischer et al. |
| 8,899,359 | B1 | 12/2014 | Hafenrichter et al. |
| 9,133,864 | B2 | 9/2015 | Menon et al. |
| 9,624,911 | B1 | 4/2017 | Griffith et al. |
| 9,919,434 | B1 | 3/2018 | Rey et al. |
| 10,135,388 | B2 | 11/2018 | Madrone et al. |
| 10,562,180 | B2 | 2/2020 | Telleria et al. |
| 2005/0034752 | A1 | 2/2005 | Gross et al. |
| 2006/0049195 | A1 | 3/2006 | Koussios et al. |
| 2009/0097994 | A1 | 4/2009 | Beck et al. |
| 2009/0115292 | A1 | 5/2009 | Ueda et al. |
| 2009/0151775 | A1 | 6/2009 | Pietrzak |
| 2009/0314119 | A1 | 12/2009 | Knoll |
| 2010/0043776 | A1 | 2/2010 | Gee |
| 2010/0125401 | A1 | 5/2010 | Hamama et al. |
| 2011/0073161 | A1 | 3/2011 | Scanlon |
| 2011/0114080 | A1 | 5/2011 | Childers et al. |
| 2012/0210818 | A1 | 8/2012 | Fischer et al. |
| 2012/0285509 | A1 | 11/2012 | Surganov |
| 2013/0247962 | A1 | 9/2013 | Sakai et al. |
| 2013/0306135 | A1 | 11/2013 | Planting |
| 2015/0244309 | A1 | 8/2015 | Sakai et al. |
| 2017/0184327 | A1 | 6/2017 | Griffith et al. |
| 2017/0282360 | A1 * | 10/2017 | Telleria .................... B25J 18/06 |

FOREIGN PATENT DOCUMENTS

| | | |
|---|---|---|
| CN | 103222067 A | 7/2013 |
| CN | 103786165 A | 5/2014 |
| CO | 6180473 A2 | 7/2010 |
| CO | 6450667 A2 | 5/2012 |
| EP | 2648226 A1 | 10/2013 |
| FR | 2603228 A1 | 3/1988 |
| JP | 2014116360 A | 6/2014 |
| KR | 101034478 B1 | 5/2011 |
| KR | 20130019502 A | 2/2013 |
| RU | 2516595 C2 | 5/2014 |
| RU | 2611571 C1 | 2/2017 |
| SU | 1346918 A1 | 10/1987 |
| WO | 2001017731 A1 | 3/2001 |
| WO | 2009108159 A1 | 9/2009 |
| WO | 2011094084 A2 | 8/2011 |
| WO | 12015378 A1 | 2/2012 |
| WO | 2016123592 A1 | 8/2016 |

OTHER PUBLICATIONS

International Search Report and Written Opinion dated Aug. 14, 2017, International Patent Application No. PCT/US2017/024730, filed Mar. 29, 2017.

International Search Report and Written Opinion dated Aug. 2, 2018, International Patent Application No. PCT/US2018/028020, filed Apr. 17, 2018, 7 pages.

(56) References Cited

OTHER PUBLICATIONS

International Search Report and Written Opinion dated Aug. 2, 2018, International Patent Application No. PCT/US2018/028024, filed Apr. 17, 2018, 7 pages.
International Search Report and Written Opinion dated Aug. 29, 2019, Patent Application No. PCT/US2019/034202, filed May 28, 2019, 7 pages.
International Search Report and Written Opinion dated Aug. 9, 2018, International Patent Application No. PCT/US2018/028025, filed Apr. 17, 2018, 7 pages.
International Search Report and Written Opinion dated May 5, 2016, International Patent Application No. PCT/US2016/015857, filed Jan. 30, 2016.
SEBA, "Solar Trillions," pp. 246-250, Jan. 28, 2010.
The Wiley Encyclopedia of Packaging Technology 3rd Ed., Wiley Publications, p. 145, Sep. 2009.

* cited by examiner

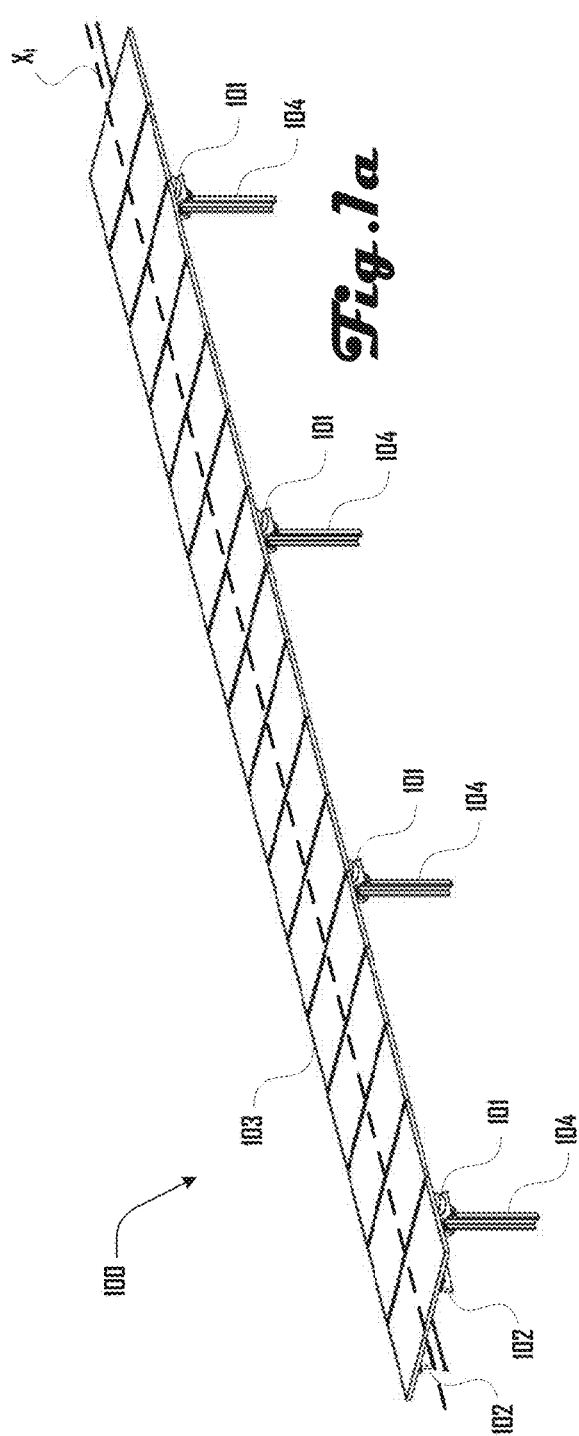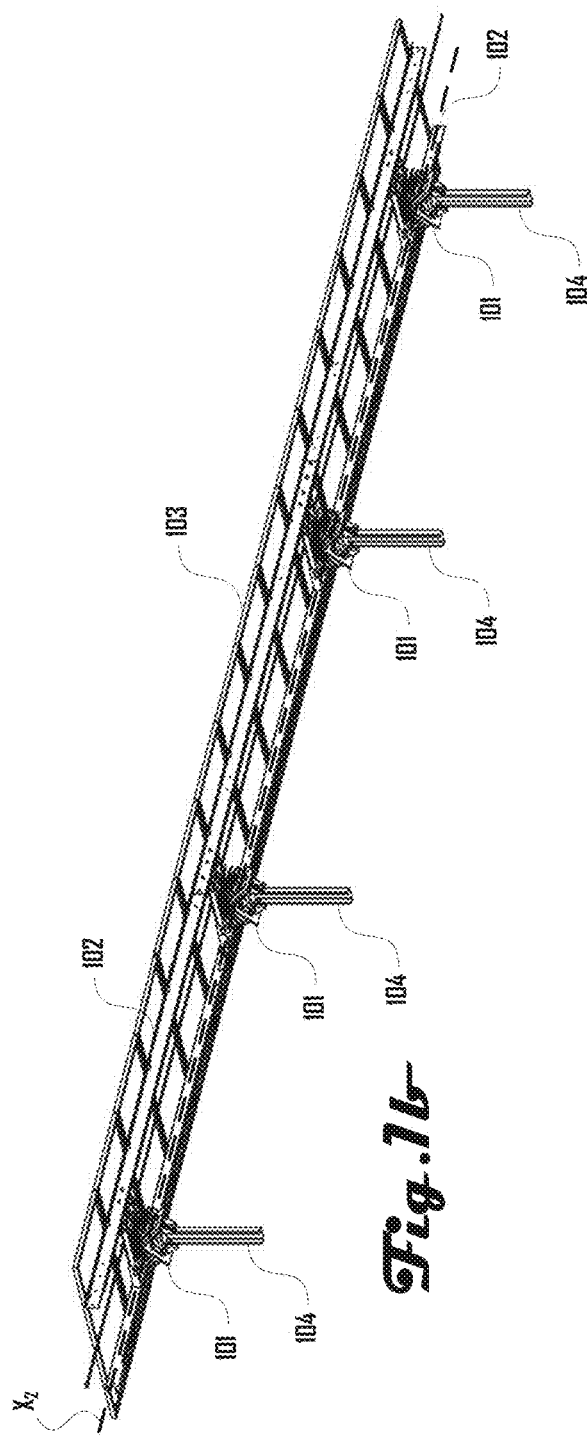

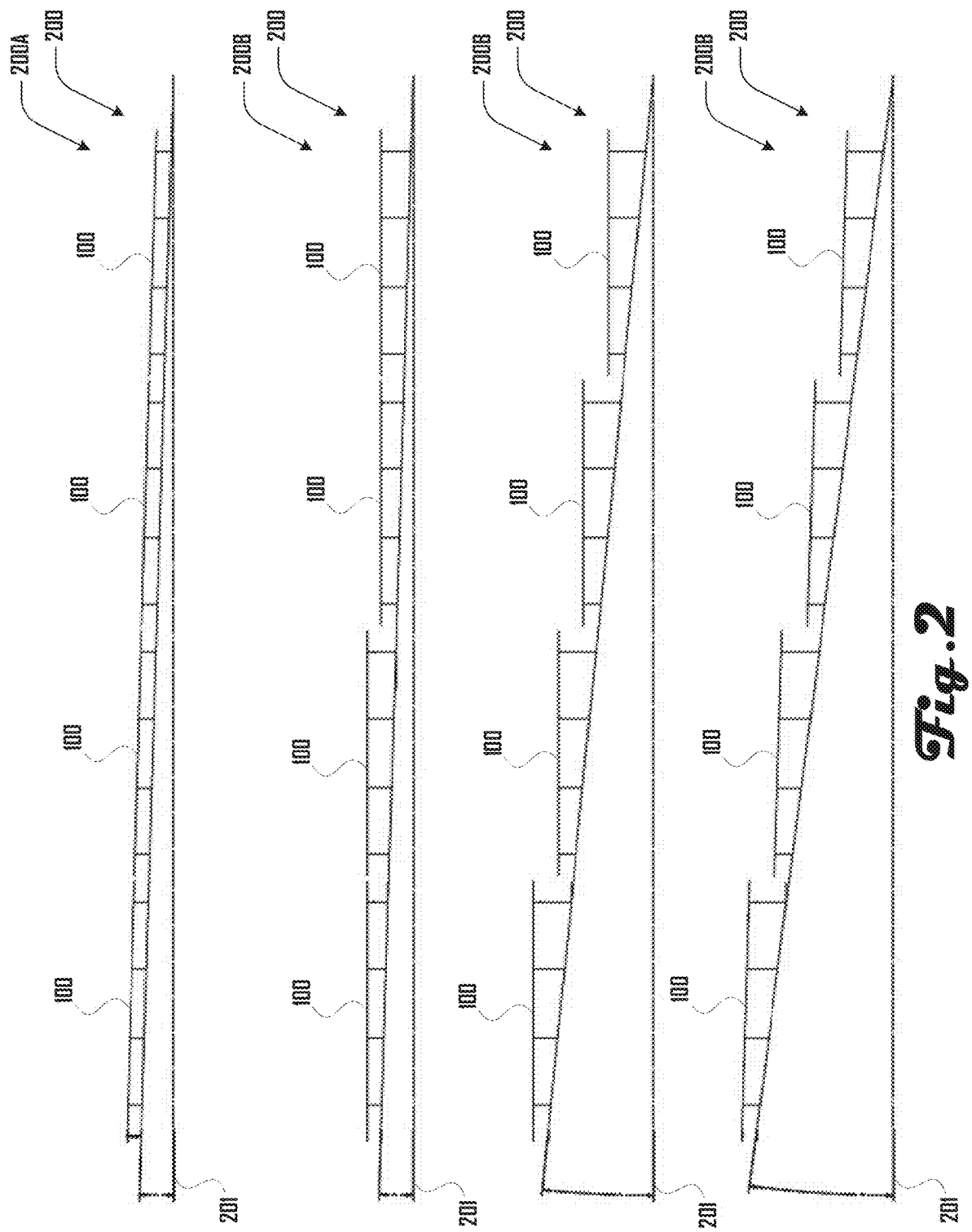

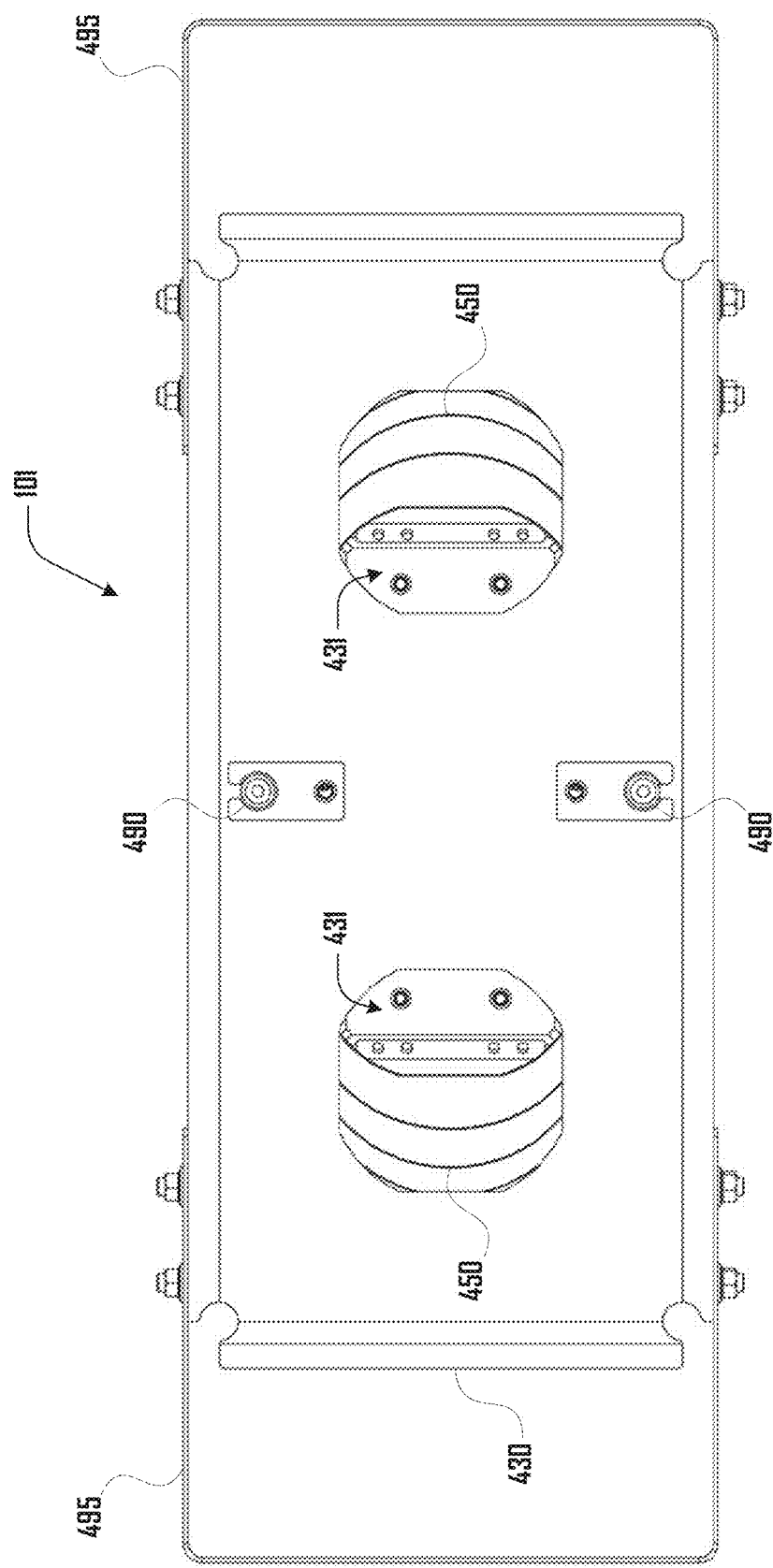

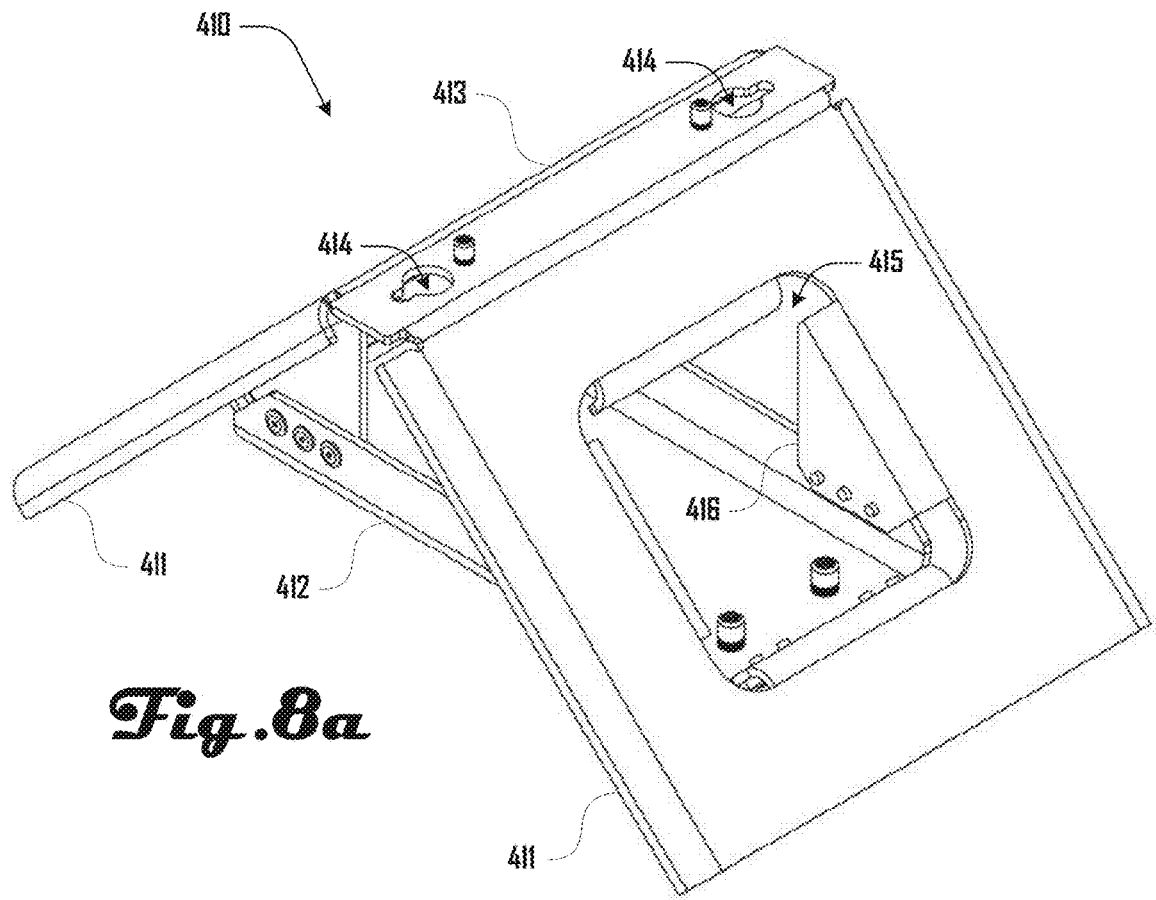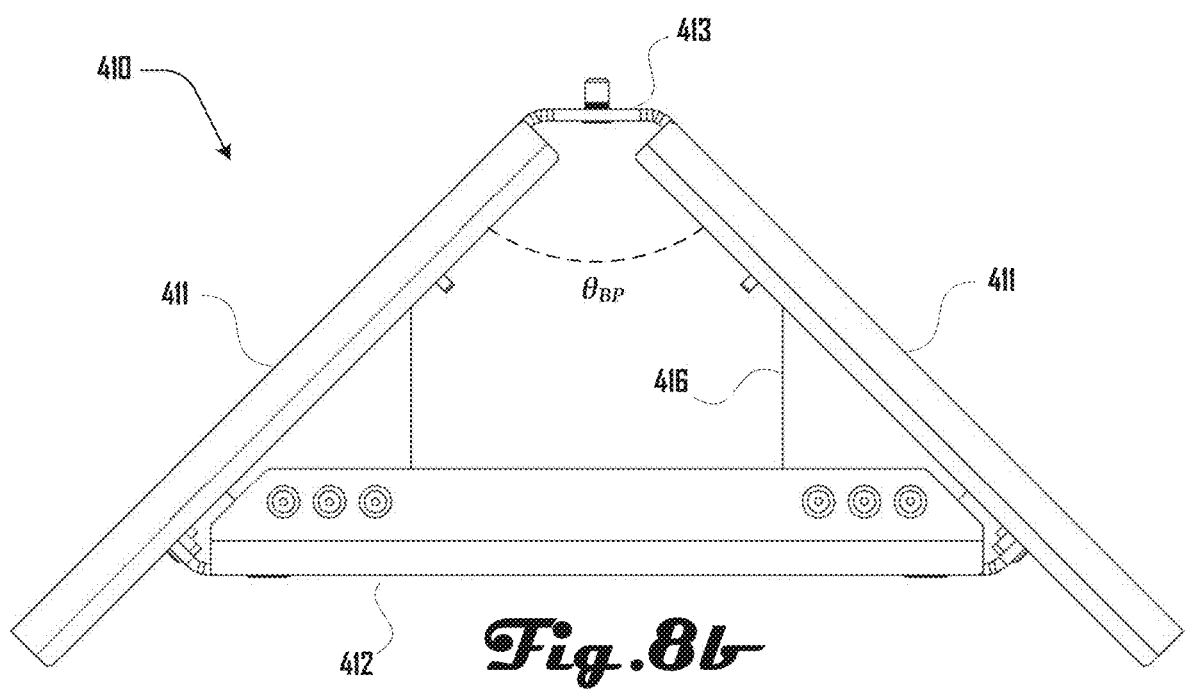

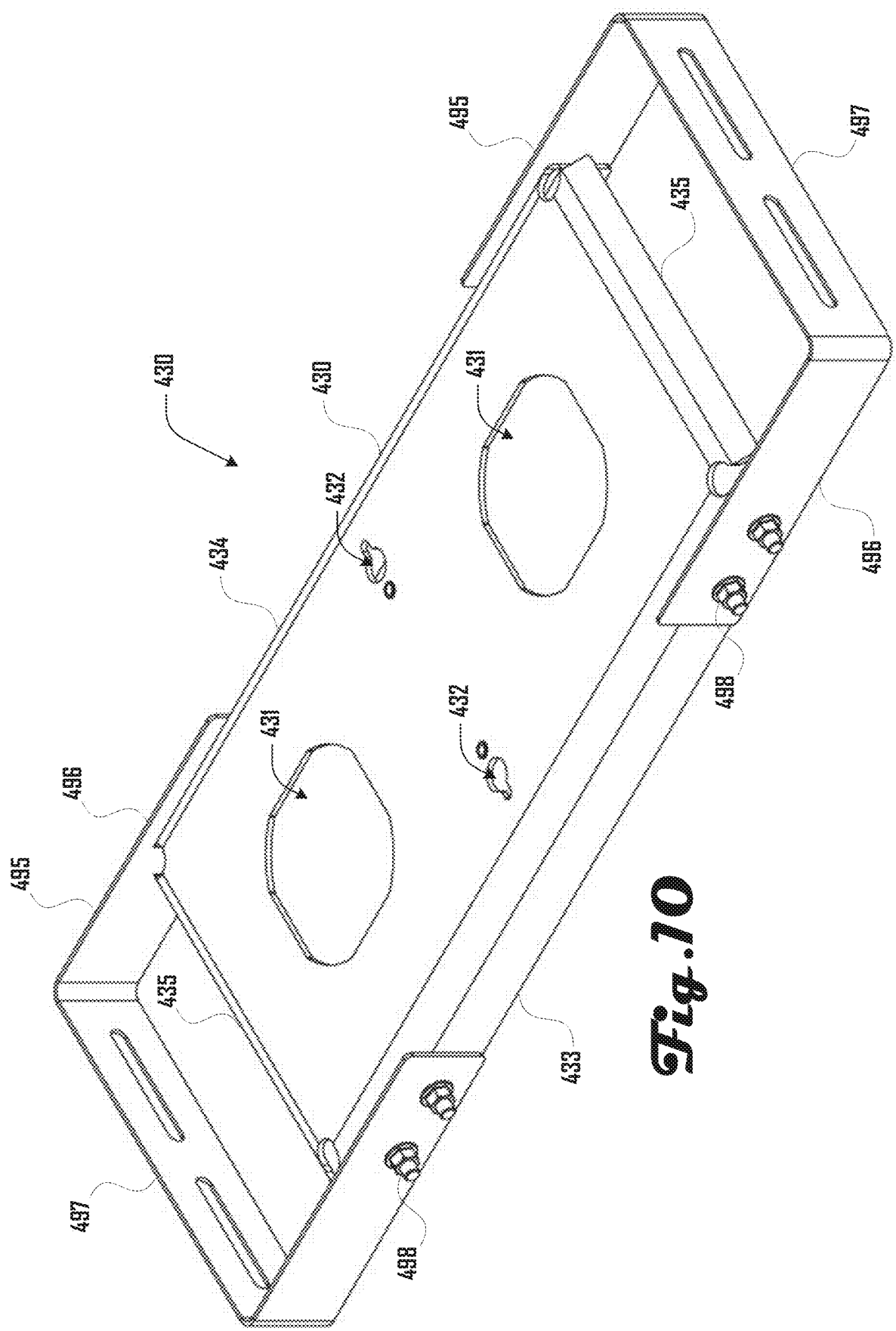

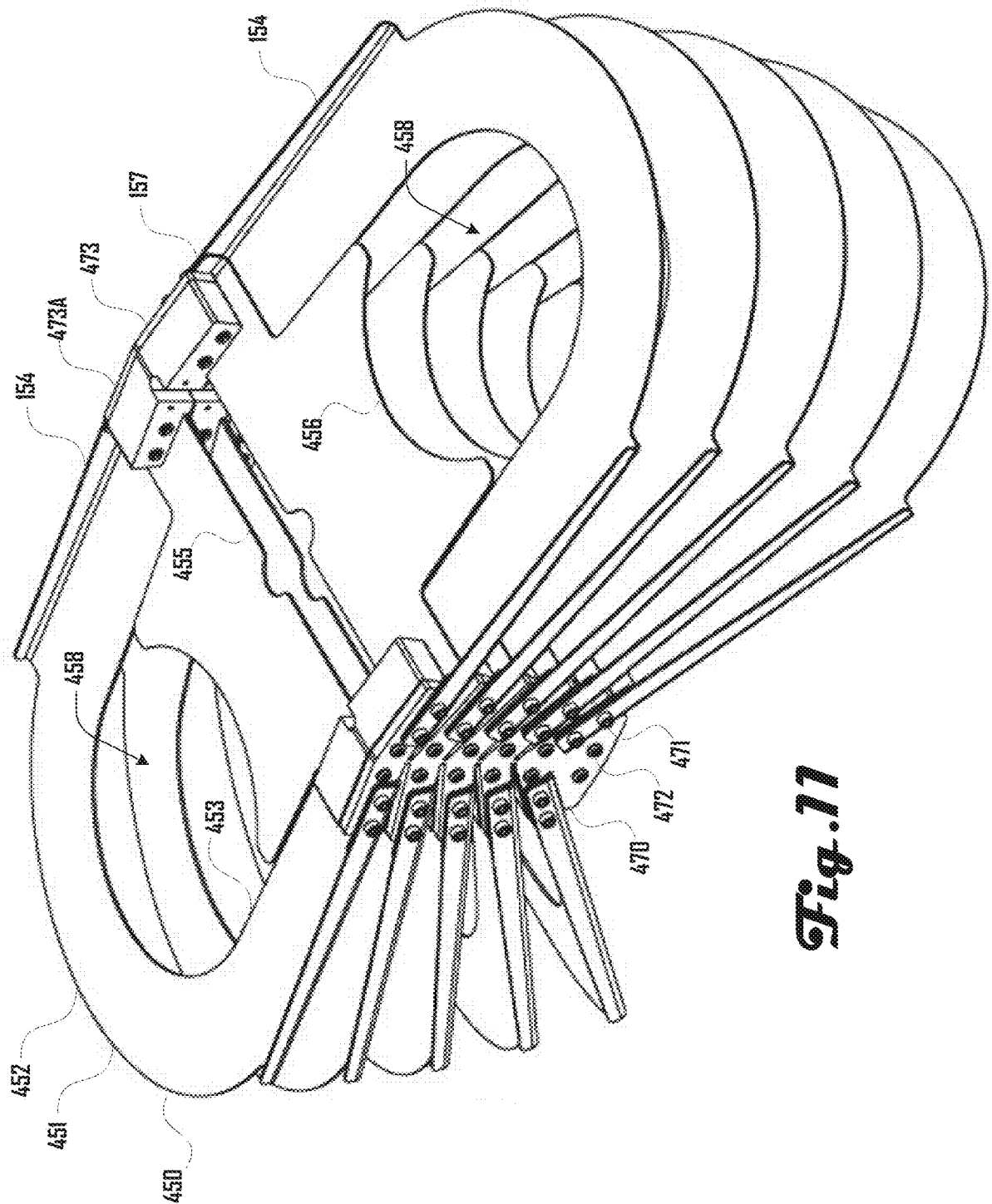

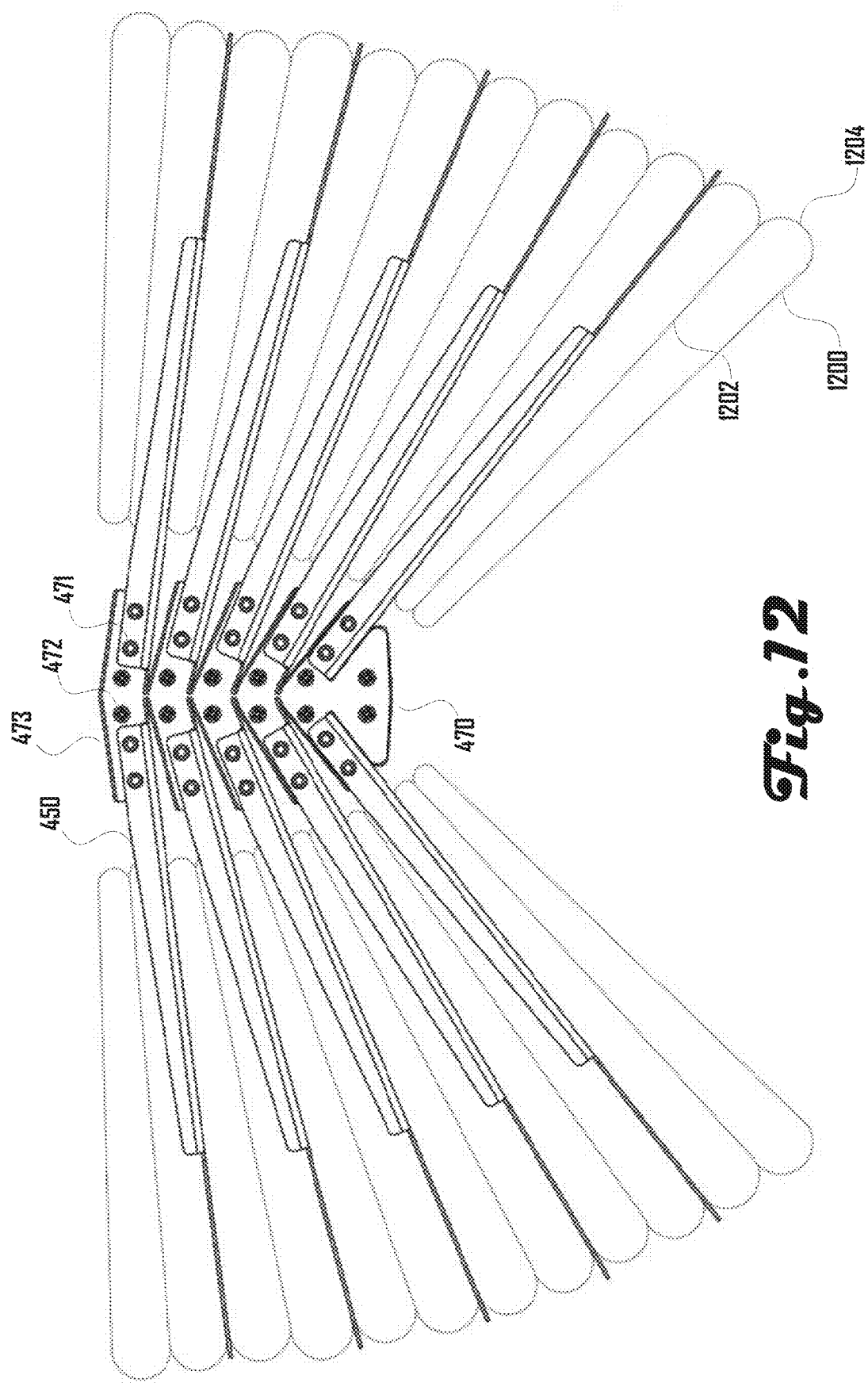

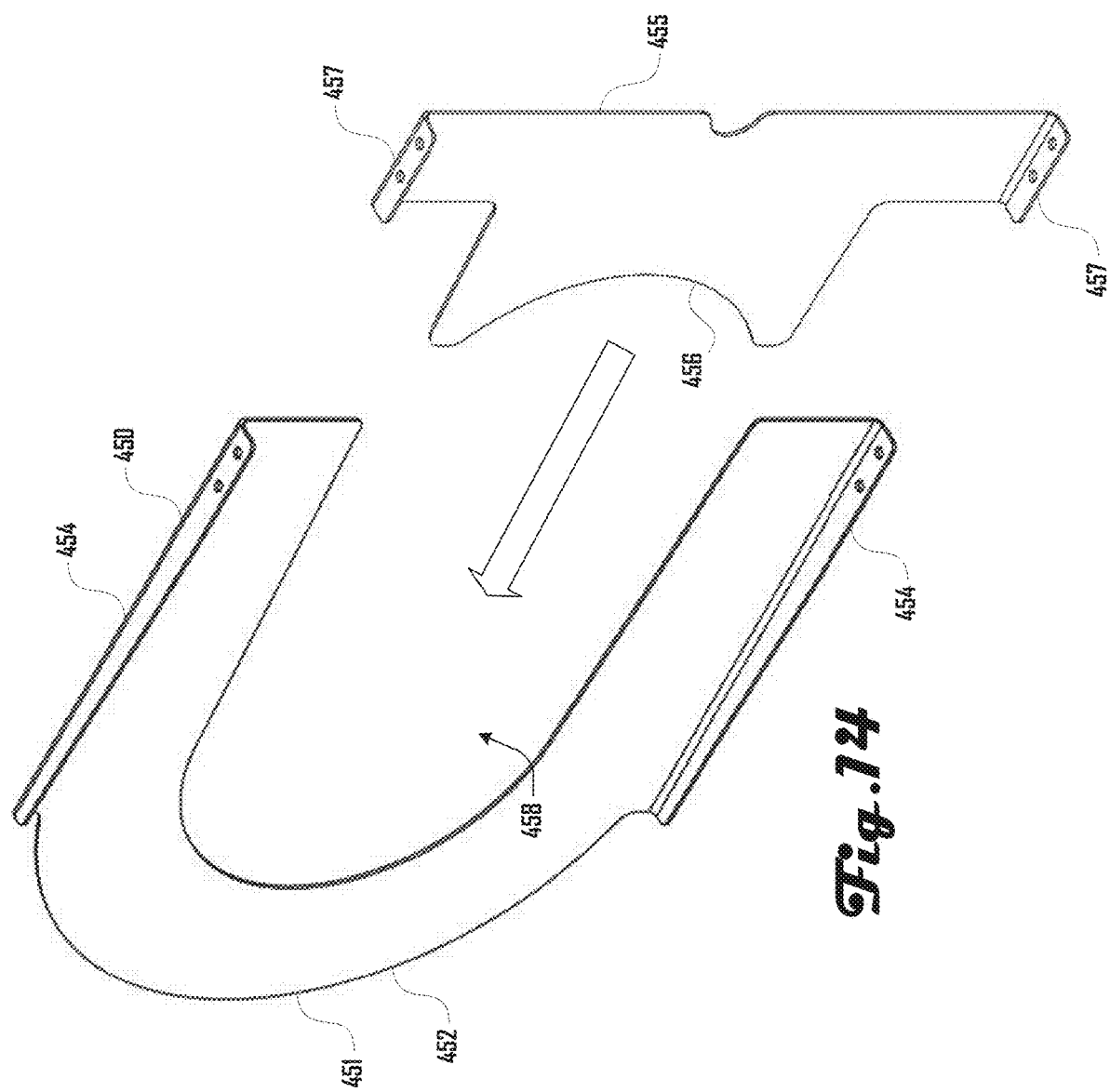

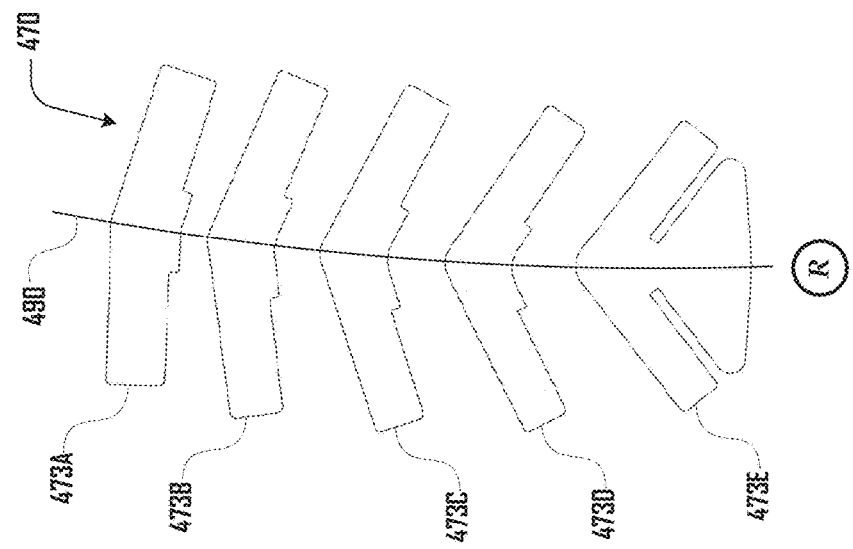
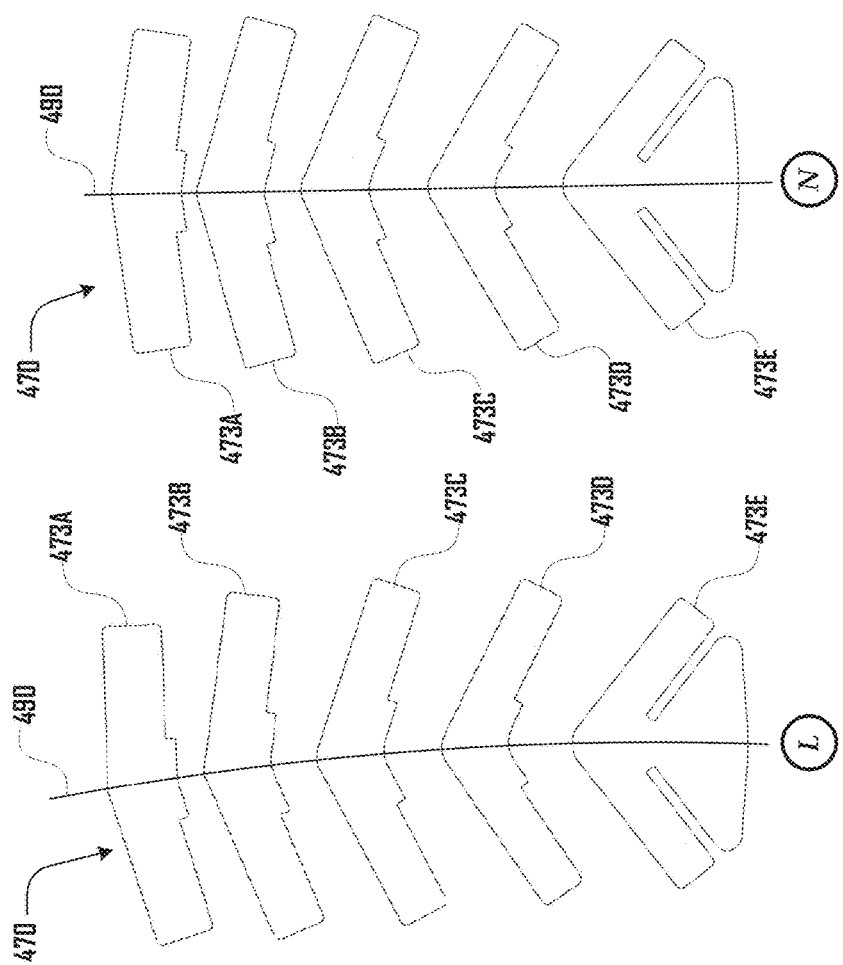
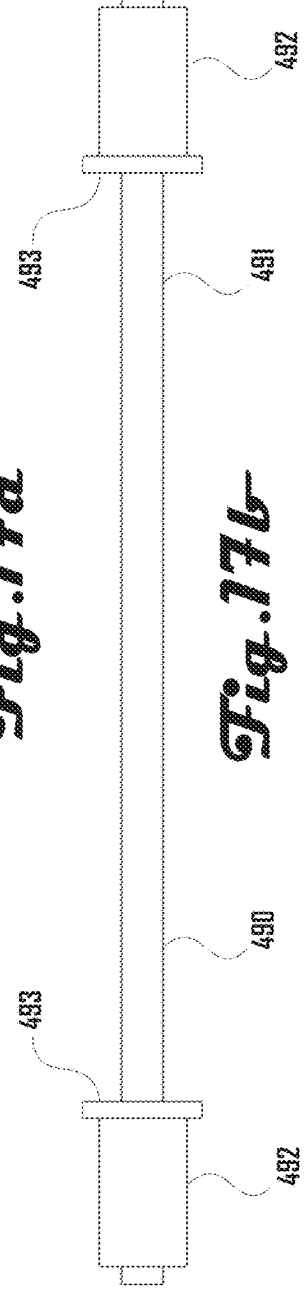
Fig. 17a
Fig. 17b

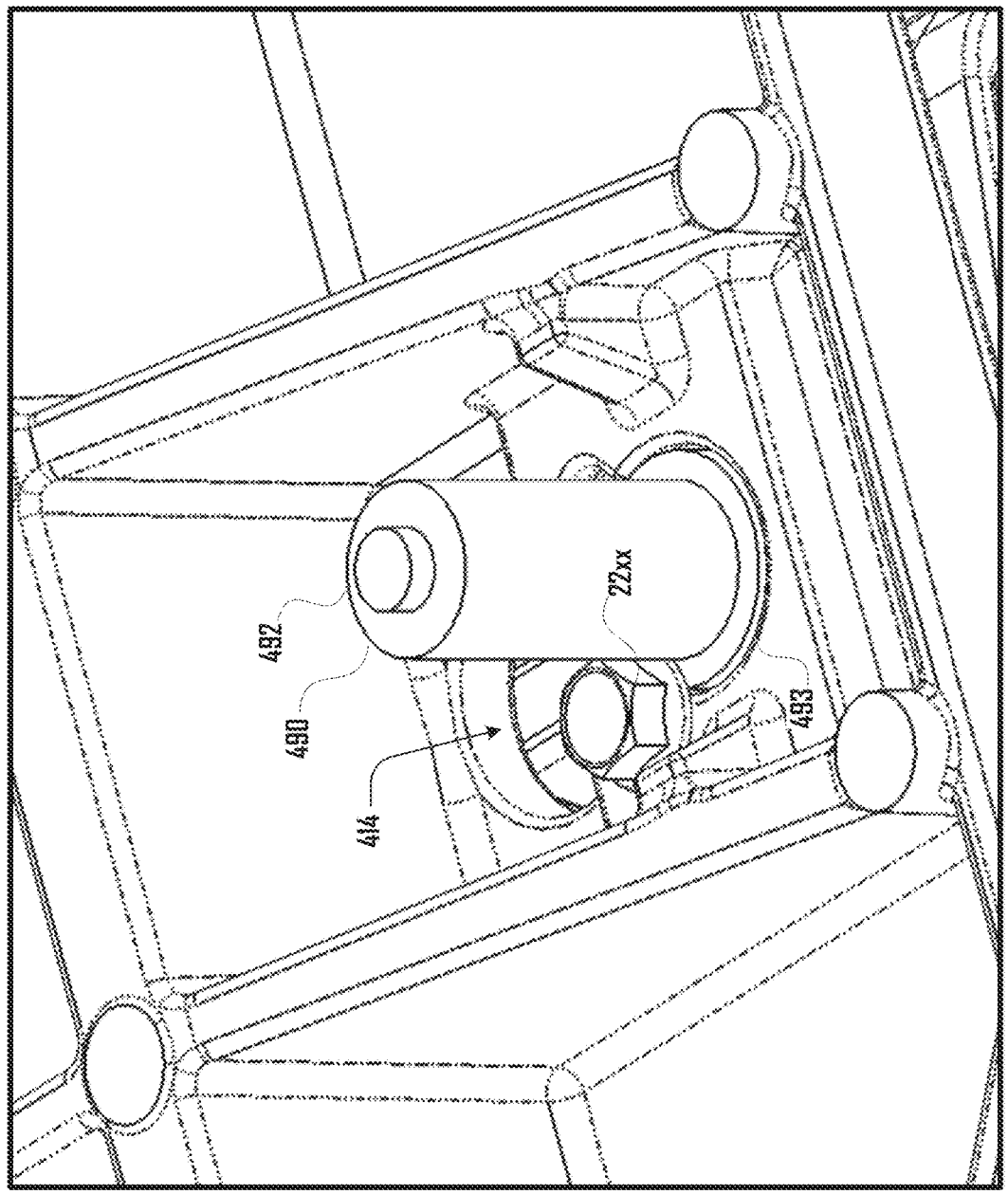

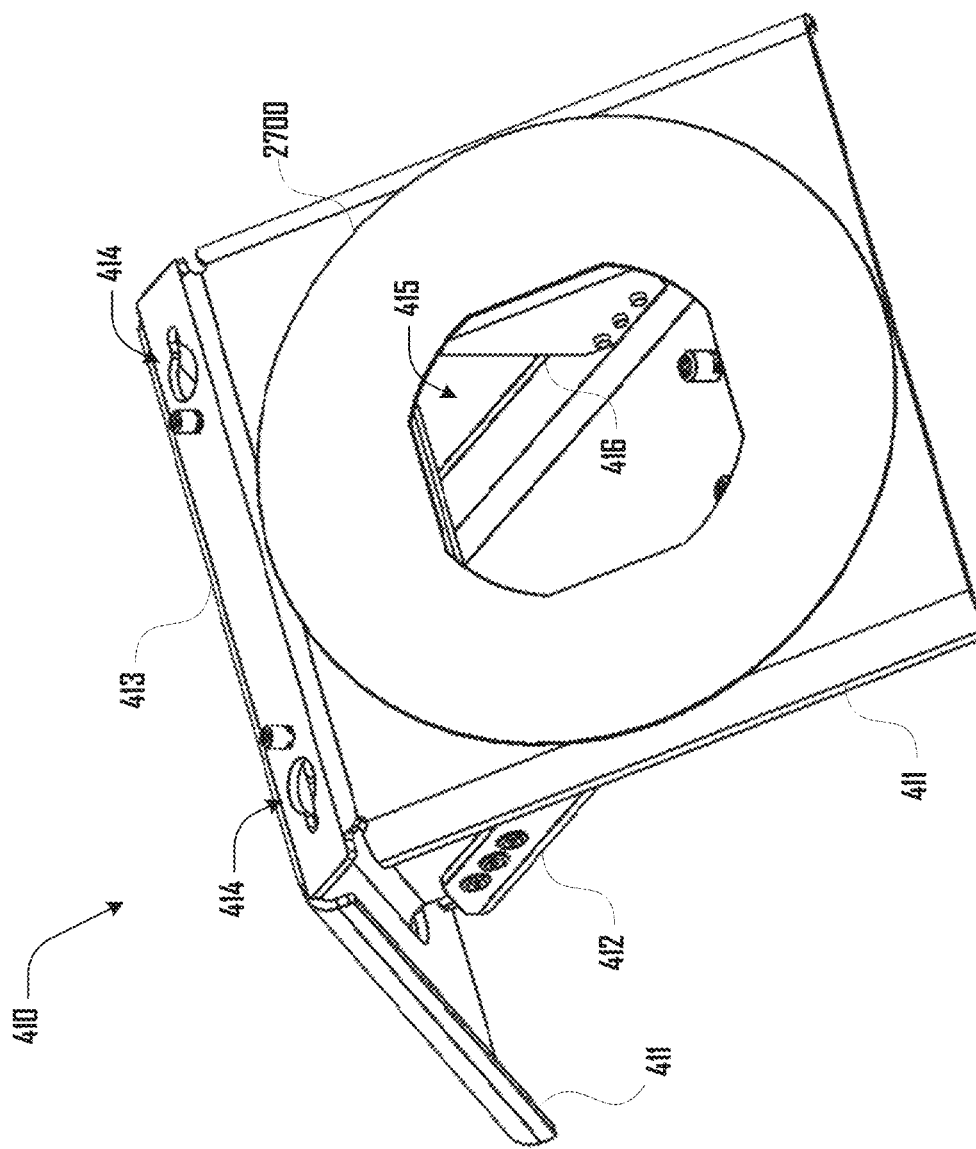

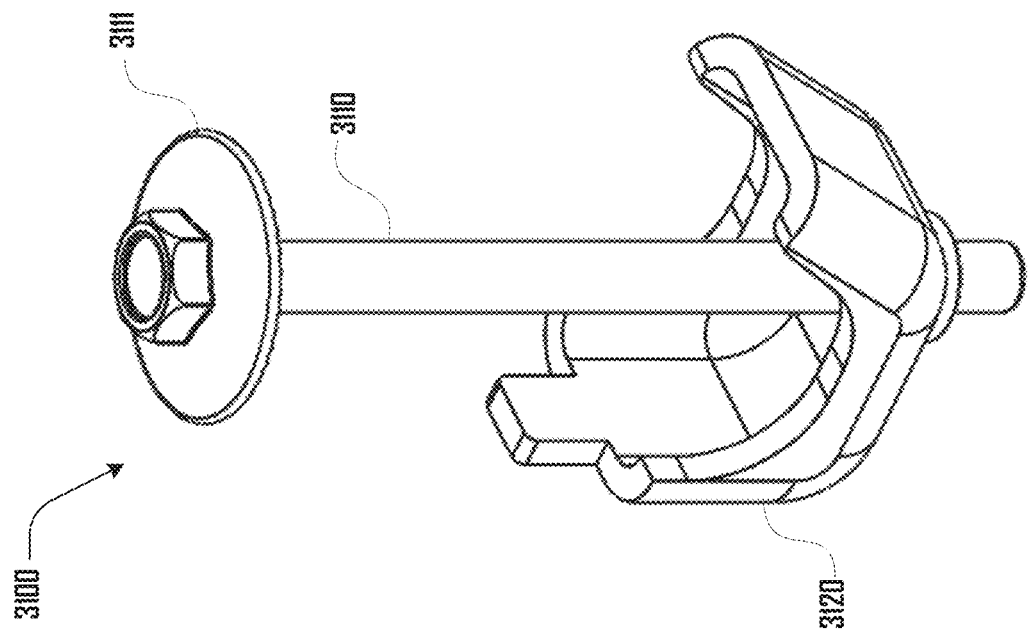
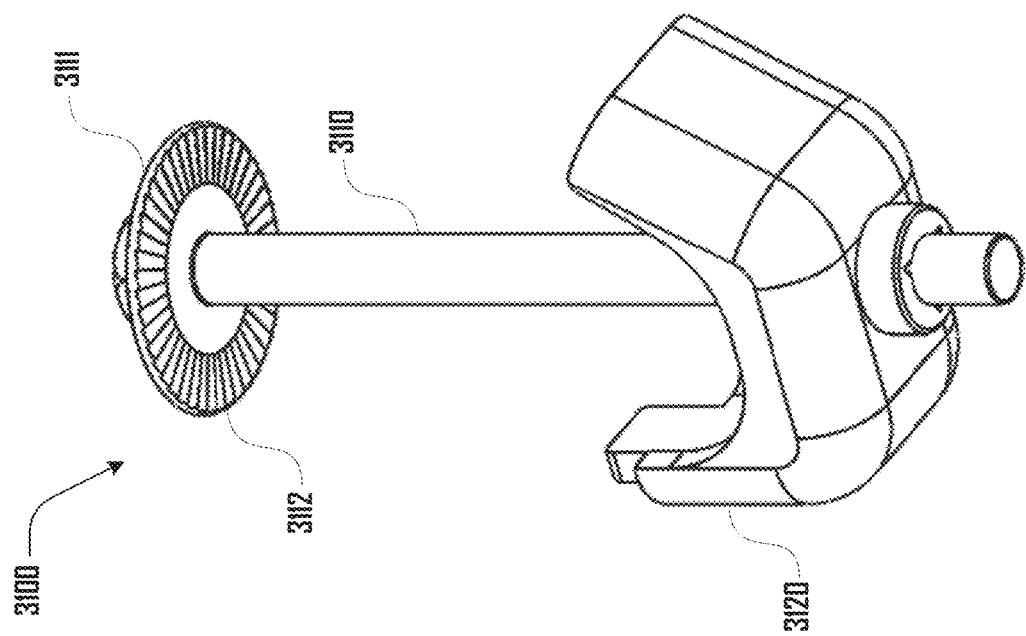

PNEUMATIC ACTUATOR SYSTEM AND METHOD

CROSS-REFERENCE TO RELATED APPLICATIONS

This application is a non-provisional of and claims priority to U.S. Provisional Applications entitled "PNEUMATIC ACTUATOR SYSTEM AND METHOD" and "PNEUMATIC ACTUATION CIRCUIT SYSTEM AND METHOD" and "SOLAR TRACKER CONTROL SYSTEM AND METHOD" respectively and having attorney docket numbers 0105935-003PR0, 0105935-004PR0 and 0105935-005PR0 and respectively having application Nos. 62/486,335, 62/486,377 and 62/486,369. These applications are hereby incorporated herein by reference in their entirety and for all purposes.

This application is related to U.S. Provisional Applications filed contemporaneously herewith entitled "SOLAR TRACKER CONTROL SYSTEM AND METHOD" and "PNEUMATIC ACTUATION CIRCUIT SYSTEM AND METHOD" respectively and having Ser. Nos. 15/955519 and 15/955506. These applications are hereby incorporated herein by reference in their entirety and for all purposes.

This application is also related to U.S. application Ser. No. 15/012,715, filed Feb. 1, 2016, which claims the benefit of U.S. provisional patent application 62/110,275 filed Jan. 30, 2015. These applications are hereby incorporated herein by reference in their entirety and for all purposes.

This application is also related to U.S. application Ser. Nos. 14/064,070 and 14/064,072, both filed Oct. 25, 2013, which claim the benefit of U.S. Provisional Application Nos. 61/719,313 and 61/719,314, both filed Oct. 26, 2012. All of these applications are hereby incorporated herein by reference in their entirety and for all purposes.

STATEMENT REGARDING FEDERALLY-SPONSORED RESEARCH

This invention was made with Government support under contract number DE-AR0000330 awarded by DOE, Office of ARPA-E. The Government has certain rights in this invention.

BRIEF DESCRIPTION OF THE DRAWINGS

FIGS. 1a and 1b illustrate a respective top perspective and bottom perspective view of a solar tracker in accordance with various embodiments.

FIG. 2 illustrates a side view of the solar tracker.

FIG. 7 illustrates a top view of the actuator of FIGS. 4-6.

FIGS. 8a and 8b illustrate respective perspective and side views of a bottom plate of an actuator in accordance with an embodiment.

FIG. 10 illustrates a perspective view of a top plate including spreader brackets extending from edges thereof.

FIG. 11 illustrates pairs of bellows washers coupled to respective hub units of a hub assembly.

FIG. 12 illustrates a side view of a pair of bellows disposed within and supported by washers.

FIGS. 13a and 13b illustrate respective side and top views of the washers in accordance with an embodiment and FIG. 14 illustrates one example embodiment of a washer that comprises inner and outer washer components, which can overlap each other and can be bound together and with the central hub assembly with fasteners through aligned mounting holes.

FIG. 17a illustrates an exploded view of the hub assembly showing example configurations of the hub units when the actuator is in various configurations.

FIG. 17b illustrates a side view of a flexure.

FIGS. 22, 23a and 23b illustrate a screw that fastens a flexure stop to the top plate in accordance with one example embodiment.

FIG. 27 illustrates a bellows contact patch maintained with a super washer.

FIGS. 31a, 31b, 32a and 32b illustrate an example embodiment of a module clamps in accordance with one embodiment.

DETAILED DESCRIPTION OF THE PREFERRED EMBODIMENTS

Figure 3:
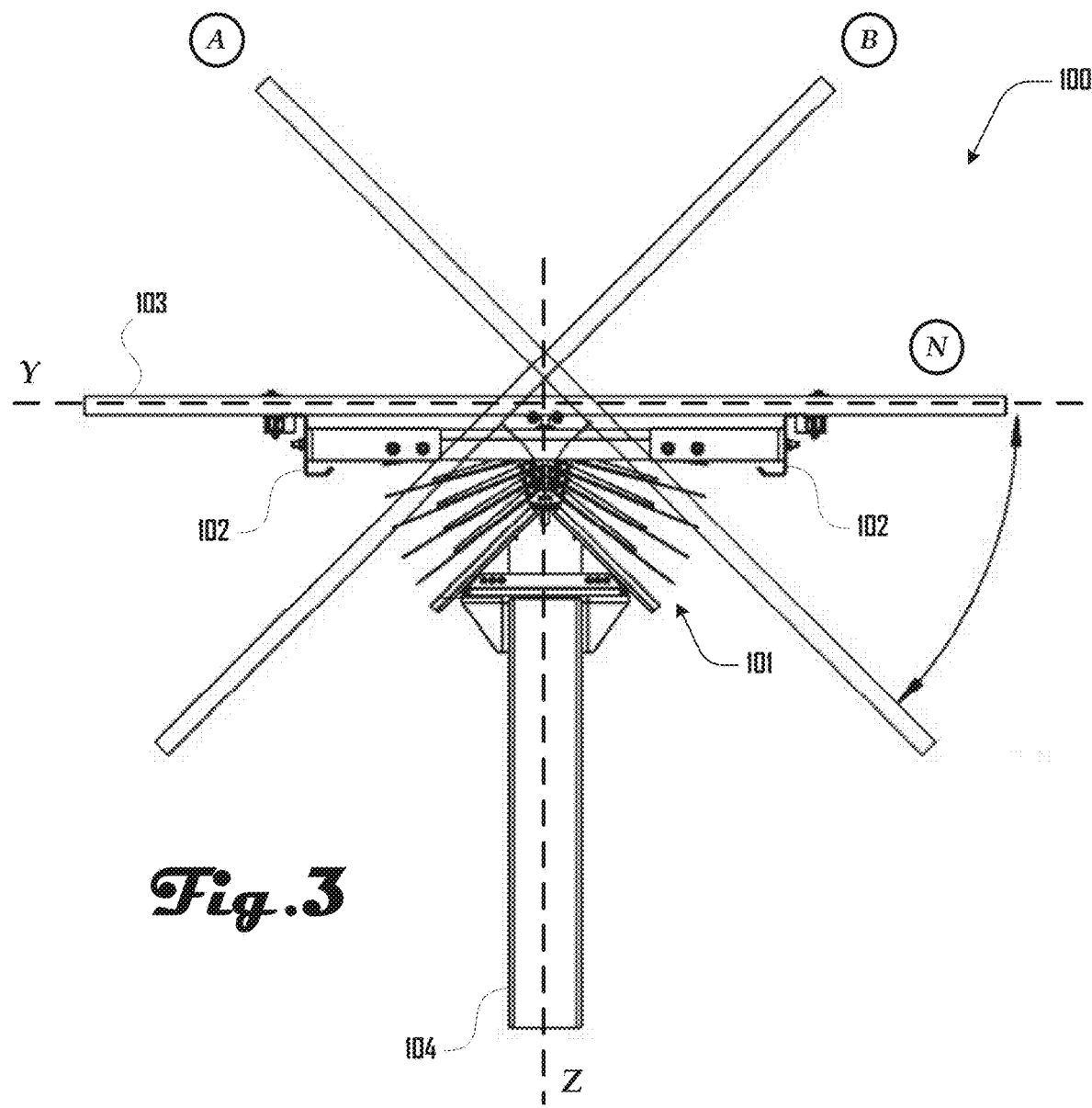
FIG. 3 illustrates examples of solar tracker arrays having a plurality of solar trackers arranged in a linearly aligned row on a portion of the ground having increasing slopes in accordance with four respective example embodiments.

FIGS. 1a and 1b illustrate a respective top perspective and bottom perspective view of a solar tracker 100 in accordance with various embodiments. FIG. 2 illustrates a side view of the solar tracker 100. As shown in FIGS. 1a, 1b and 2, the solar tracker 100 can comprise a plurality of photovoltaic cells 103 disposed along a length having axis $X_1$ and a plurality of pneumatic actuators 101 configured to collectively move the array of photovoltaic cells 103. As shown in FIG. 1b, the photovoltaic cells 103 are coupled to rails 102 that extend along parallel axes $X_2$, which are parallel to axis $X_1$. Each of the plurality of actuators 101 extend between and are coupled to the rails 102, with the actuators 101 being coupled to respective posts 104. As shown in FIG. 2, the posts 104 can extend along an axis Z, which can be perpendicular to axes $X_1$ and $X_2$ in various embodiments.

As shown in FIG. 2, and discussed in more detail herein, the actuators 101 can be configured to collectively tilt the array of photovoltaic cells 103 based on an angle or position of the sun, which can be desirable for maximizing light exposure to the photovoltaic cells 103 and thereby maximizing, enhancing or optimizing electrical output of the photovoltaic cells 103. In various embodiments, the actuators 101 can be configured to move the photovoltaic cells 103 between a plurality of configurations as shown in FIG. 2, including a neutral configuration N where the photovoltaic cells 103 are disposed along axis Y that is perpendicular to axis Z. From the neutral configuration N, the actuators 101 can be configured to move the photovoltaic cells 103 to a first maximum tilt position A, to a second maximum tilt position B, or any position therebetween. In various embodiments, the angle between the neutral configuration N and the maximum tilt positions A, B can be any suitable angle, and in some embodiments, can be the same angle. Such movement can be used to position the photovoltaic cells 103 toward the sun, relative to an angle of the sun, to reflect light toward a desired position, or the like.

In one preferred embodiment as shown in FIGS. 1a and 1b, a solar tracker 100 can comprise a plurality of photovoltaic cells 103 that are collectively actuated by four actuators 101 disposed along a common axis. However, in further embodiments, a solar tracker 100 can comprise any suitable number of actuators 101 including one, two, three, four, five, six, seven, eight, nine, ten, fifteen, twenty, fifty, one hundred, or the like. Similarly, any suitable number of photovoltaic cells 103 can be associated with a solar tracker 100 in further embodiments. Also, any suitable size, shape or type of photovoltaic cells 103 can be associated with a solar tracker 100 in further embodiments. Additionally, while photovoltaic cells 103 are shown in example embodiments herein, in further embodiments, actuators 101 can be used to move various other objects or structures, including mirrors, reflectors, imaging devices, water purification, water collection, communications devices, and the like.

FIG. 3 illustrates examples of solar tracker arrays 300 having a plurality of solar trackers 100 arranged in a linearly aligned row on a portion of the ground 301 having increasing slopes in accordance with four respective example embodiments 300A, 300B, 300C, 300D. For example, the first embodiment 300A has the least slope and shows the trackers having posts 104 that are substantially the same length with the axis of the four solar trackers 100 conforming to the slope of the ground 301 and generally aligned along a common axis.

The second embodiment 300B shows pairs of solar trackers 100 aligned along a common axis that is perpendicular to the pull of gravity (or parallel to level ground), with the pairs being disposed at different axes at different heights above the ground 301. The third embodiment 300C shows solar trackers 100 aligned in parallel, but not coincident axes that are perpendicular to the pull of gravity (or parallel to level ground), with the solar trackers 100 each being disposed at different axes at different heights above the ground 301. The fourth embodiment 300D shows solar trackers 100 aligned in parallel, but not coincident axes, that are not perpendicular to the pull of gravity (or parallel to level ground), with the solar trackers 100 each being disposed at different axes at different heights above the ground 301.

In some examples, it can be desirable to tilt actuators 101 (see e.g., FIG. 2) of the solar trackers 100 to be perpendicular to the slope of the ground 301, while keeping posts 104 plumb to gravity. Accordingly, in some embodiments, a Z axis of an actuator 101 can be installed skew to a Z-axis of a post 104 associated with the actuator 101.

In various embodiments, the solar trackers 100 of a solar tracker array 300 can be pneumatically or fluidically coupled via a pneumatic or fluidic system that can actuate the solar trackers 100 of the solar tracker array 300 in unison. In other words, the solar trackers 100 of the solar tracker array 300 can be driven collectively to have the same angle.

Although FIG. 3 illustrates four example embodiments 300A, 300B, 300C, 300D of solar tracker arrays 300, these examples should not be construed to be limiting on the wide variety of alternative embodiments that are within the scope and spirit of the present disclosure. For example, while FIG. 3 shows solar tracker arrays 300 having solar trackers 100 aligned in linear rows, further embodiments can have tracker arrays 300 aligned in any suitable way, including an arc, a series of parallel rows, and the like. Additionally, in further embodiments, solar tracker arrays 300 can comprise any suitable number of solar trackers 100. Also, in some embodiments, a plurality of solar tracker arrays 300 can be configured into a solar tracker system.

Some embodiments can include one or more of a ballasted actuator version with no bottom plate, a torque tube or a custom module mounting. Further embodiments can include an expanded web beam, comprising a web of an I-beam or C-channel that can be slit with three offset rows of slits and expanded like expanded metal to form triangular trusses in the web and a higher stiffness beam. In some embodiments, racking configurations can include torque tubes, c-channels, extruded aluminum sections, custom roll formed shapes, hot rolled steel sections, and the like. Still further embodiments can include ballast under the actuator modules to reduce the center of mass height, and such reduced center of mass height can lead to better tracking performance. Other embodiments can include a terrain-following tracker, which can comprise non-moment carrying racking connections to allow the tracker 100 to be installed with variable slope throughout the length of the tracker 100. Some embodiments can include any suitable damper or damper system for flutter reduction, including a centrifugal clutch, viscous damper, viscoelastic materials, friction damper, linear damper, rotary damper, or the like.

Figure 4:
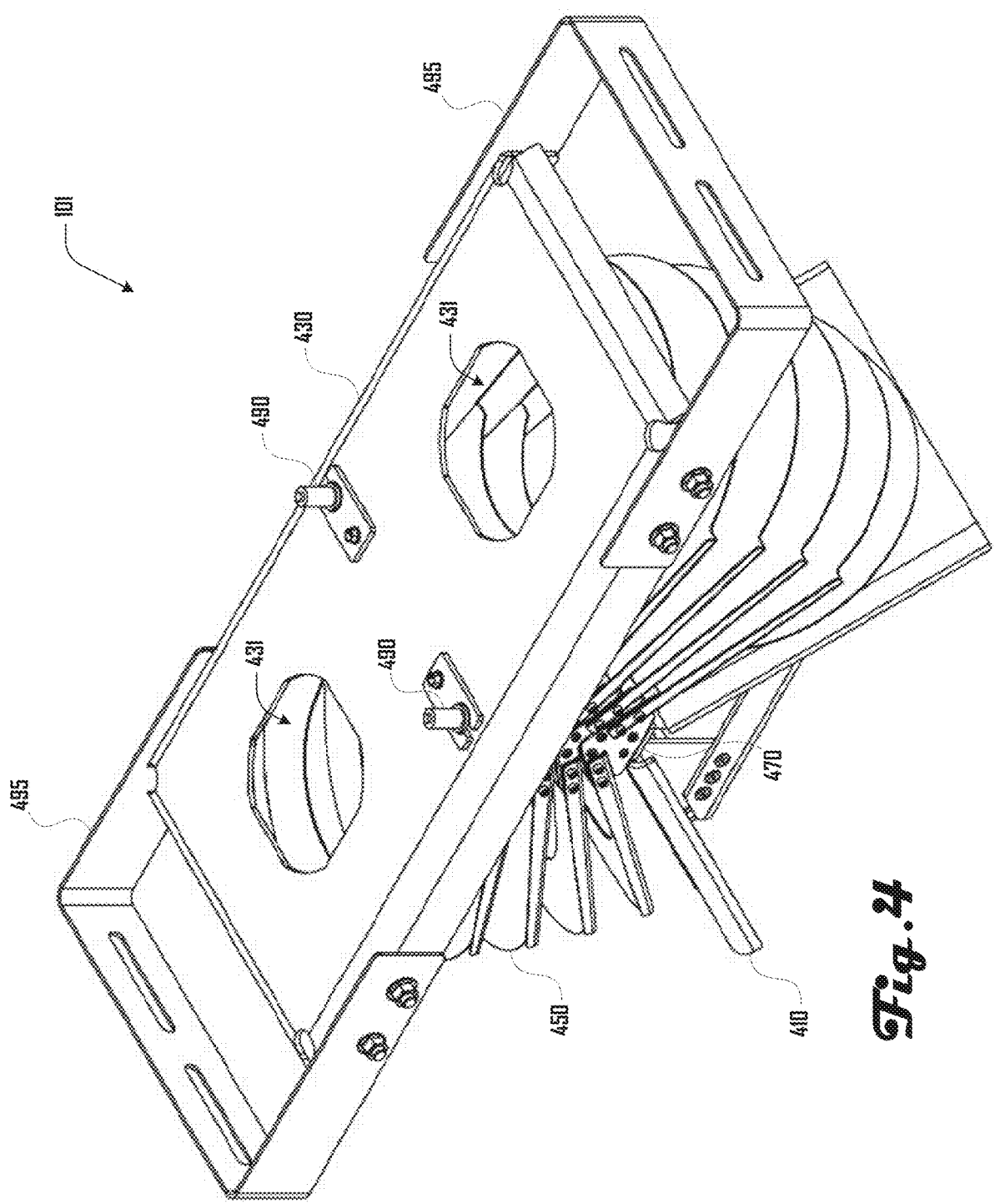
FIG. 4 illustrates a perspective view of an actuator in accordance with one embodiment.
Figure 5:
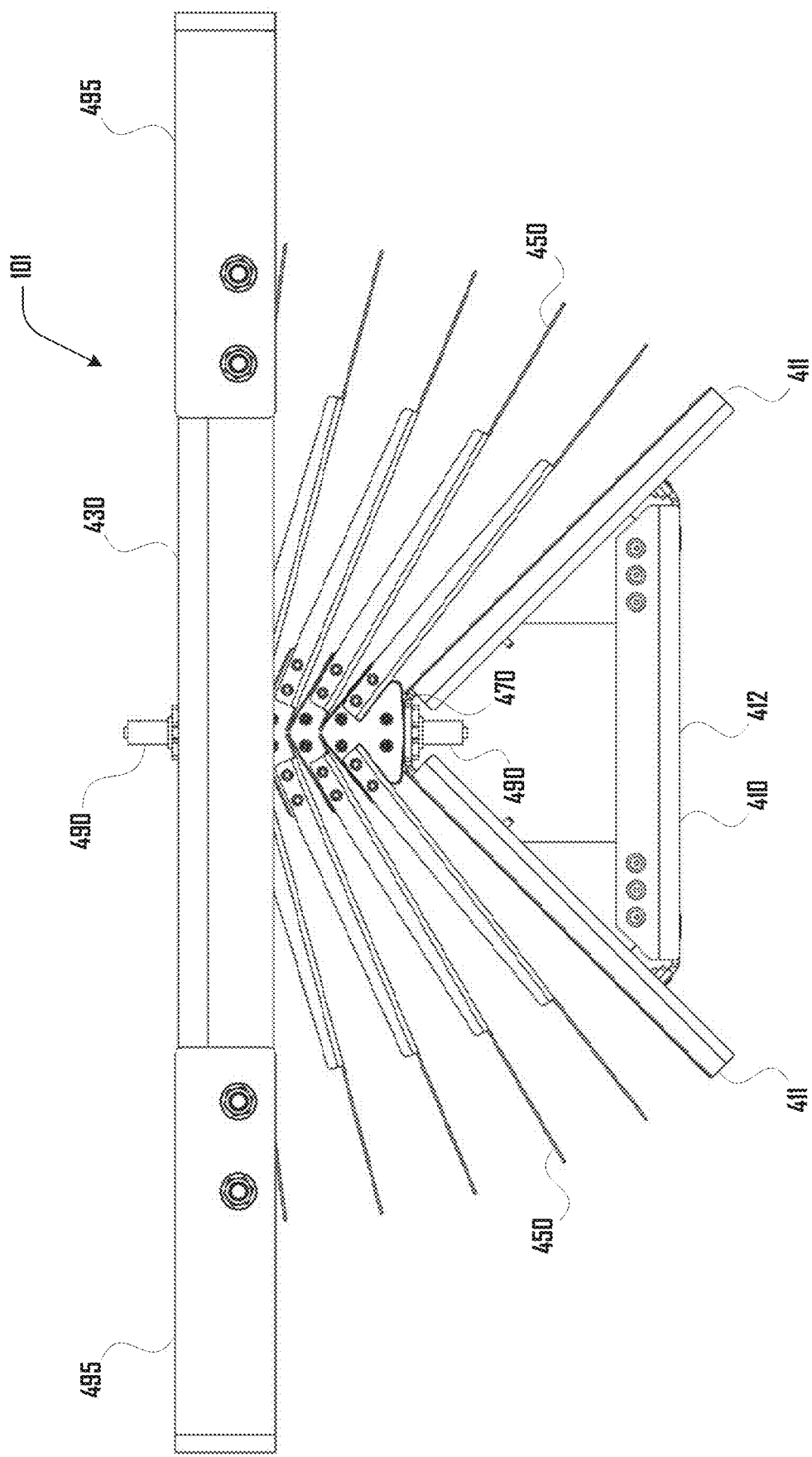
FIG. 5 illustrates a side view of the actuator of FIG. 4.
Figure 6:
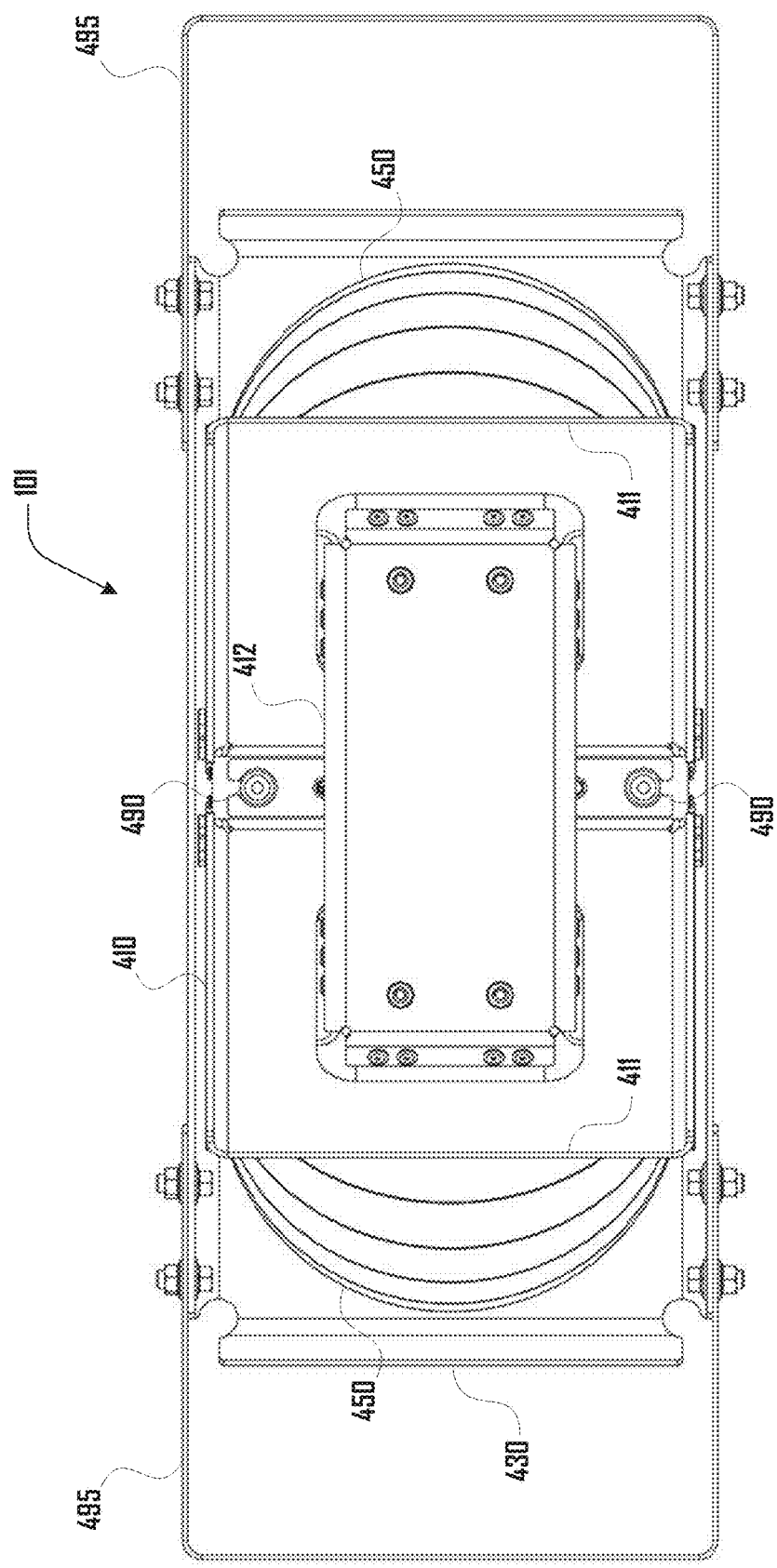
FIG. 6 illustrates a bottom view of the actuator of FIGS. 4 and 5.

FIG. 4 illustrates a perspective view of an actuator 101 in accordance with one embodiment. FIG. 5 illustrates a side view of the actuator 101 of FIG. 4. FIG. 6 illustrates a bottom view of the actuator of FIGS. 4 and 5. FIG. 7 illustrates a top view of the actuator 101 of FIGS. 4-6. As shown in the example of FIGS. 4-7, the actuator 101 comprises a V-shaped bottom plate 410, a planar top-plate 430, and a set of washers 450 that are disposed between the top and bottom plates 430, 410. The washers 450 are coupled to a hub assembly 470 that extends between the bottom and top plates 410, 430. A pair of flexures 490 can also extend between the bottom and top plates 410, 430 and engage the one or more hub assembly 470. A pair of spreader brackets 495 can extend from edges of the top plate 430.

The example embodiment of FIGS. 4-7 illustrate the actuator 101 in a neutral configuration (see FIG. 2), where the top plate 430 and spreader brackets 495 extend along perpendicular axes $X_A$, $Y_A$, which are both perpendicular to axis $Z_A$ in the neutral configuration. However, as discussed herein, the top plate 430 can be configured to tilt to the left and right. Components of an actuator 101 can comprise various suitable materials, including metal (e.g., steel, aluminum, iron, titanium, or the like), plastic, or the like. In various embodiments, metal parts can be coated for corrosion prevention (e.g., hot dip galvanized, pre galvanized, non-zinc based corrosion resistant coatings, or the like). Components of the actuator 101 and use thereof is discussed in more detail below.

Figure 9A:
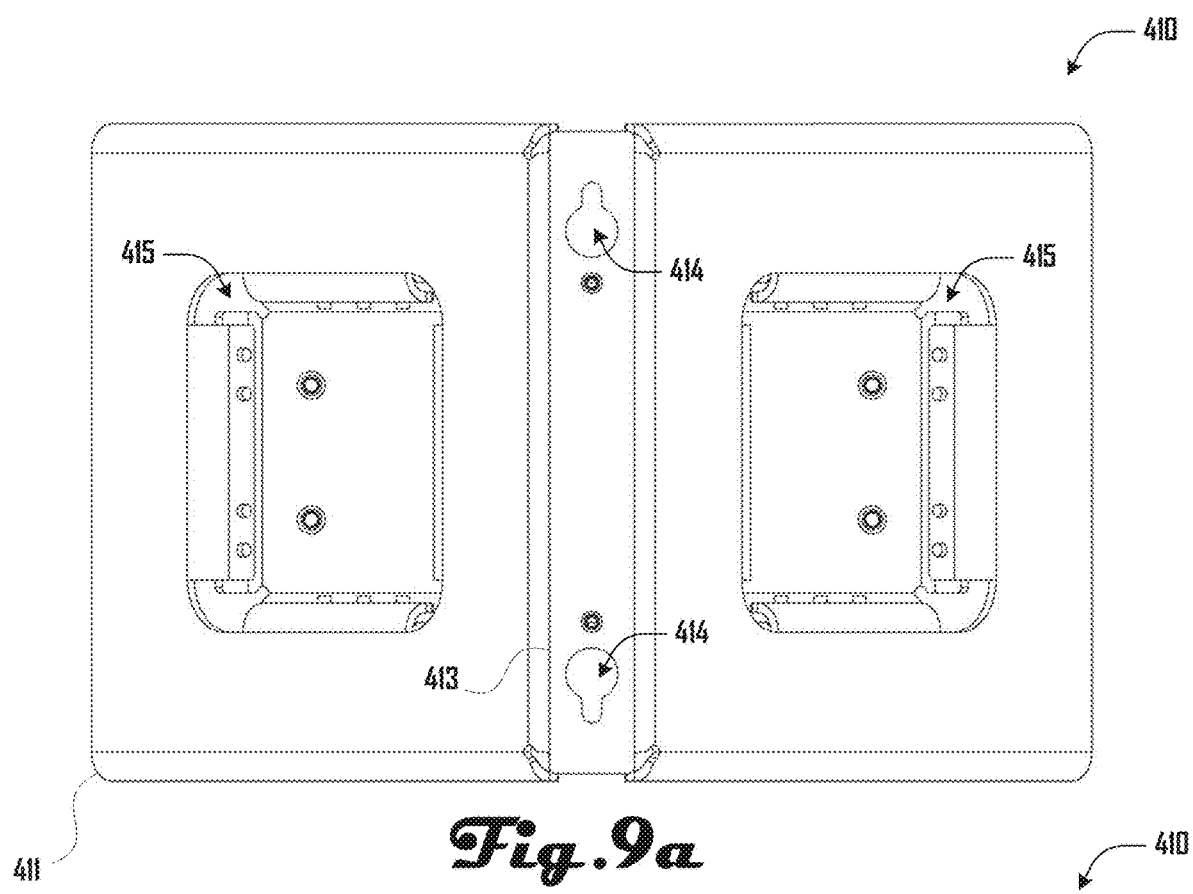
FIGS. 9a and 9b illustrate respective top and bottom views of the bottom plate of the embodiment of FIGS. 8a and 8b.
Figure 9B:
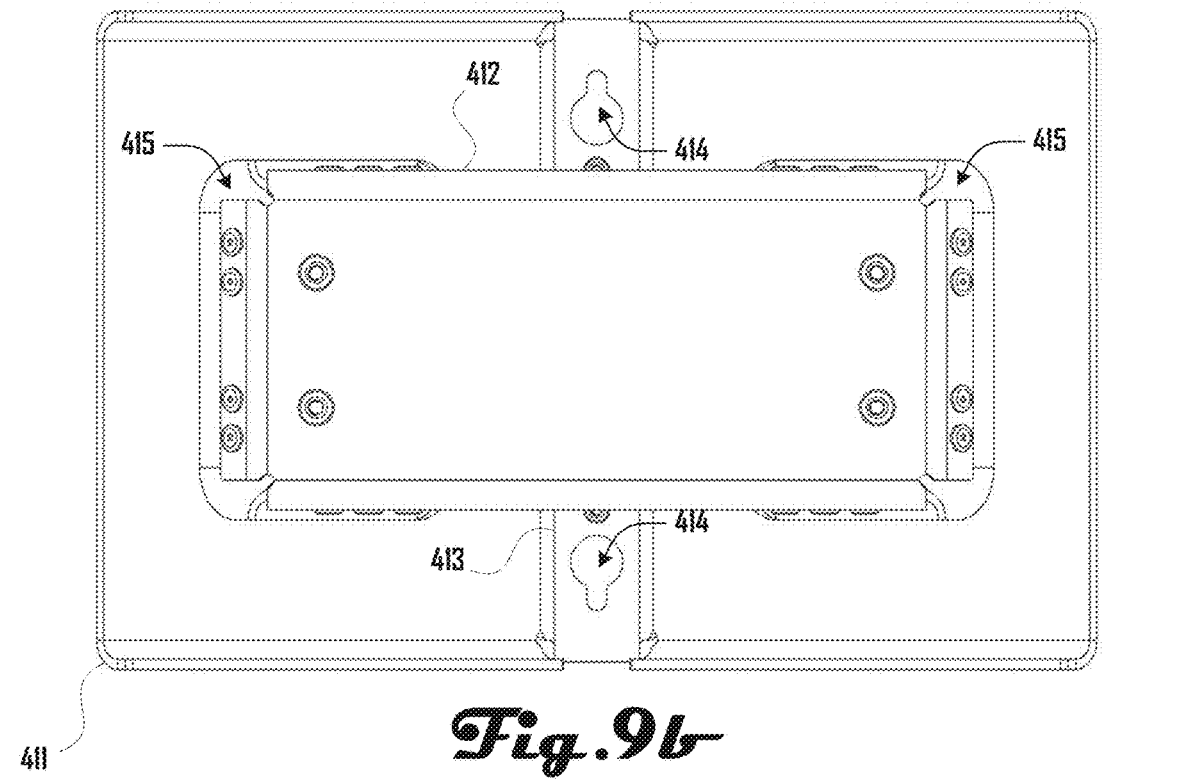

FIGS. 8a and 8b illustrate respective perspective and side views of a bottom plate 410 of an actuator 101 in accordance with an embodiment and FIGS. 9a and 9b illustrate respective top and bottom views of the bottom plate 410 of the embodiment of FIGS. 8a and 8b. As shown in FIGS. 8a, 8b, 9a and 9b, the bottom plate 410 comprises a pair of plate arms 411 and a base 412 that extends between and couples to the plate arms 411. As shown in FIG. 8b, the plate arms 411 can extend from a planar cap 413 at an angle of $\theta_{BP}$. The base 412 can extend along an axis $Y_{BP}$, which is perpendicular to axis $Z_{BP}$, which bisects the cap 413 and angle $\theta_{BP}$ and is coincident with a plane of symmetry of the bottom plate 410. Angle $\theta_{BP}$ can be any suitable angle, but in one preferred embodiment $\theta_{BP}=90°$.

The cap 413 can define a pair of cap coupling slots 414, which can be configured to couple with and engage respective flexures 490 (see, e.g., FIGS. 4-7 and 17a) that extend between the bottom plate 410 and the top plate 430 as described in more detail herein. The plate arms 411 can define planar faces that define bottom plate coupling ports 415, which can be configured to couple with bellows 1200 (see, e.g., FIGS. 12 and 19-21) as described in more detail herein. In some examples, a thin metal plate, super washer (e.g., a super washer 2700 as shown in FIG. 27), or the like, can be incorporated between the bellows 1200 and the bottom plate 410 to maintain a desired contact surface between the bellows 1200 and the bottom plate 410.

The bottom plate 410 can further comprise supports 416 that couple and reinforce a coupling of the plate arms 411 and the base 412. The cap 413 can further comprise a pair of rivet nuts 417 that hold bolts that secure the flexure stop 495 and can keep the flexure 490 in place (see, e.g., FIGS. 4, 5 and 15-18) as described in more detail herein.

In various embodiments, the bottom plate 410 can be configured to couple with a post 104 (see, e.g., FIGS. 1a, 1b and 2) that couples the bottom plate 410 to the ground or other location. In some embodiments, a pile interface bracket can include two brackets. Pile interface brackets can be a folded, stamped, or punched sheet metal part, or the like, and can be made of various suitable materials (e.g., aluminum) and can be make via any suitable process including die casting, extrusion, roll forming, and the like. In various embodiments, the pile interface bracket can attach to flanges of actuators 101, and can allow for various suitable types of adjustment, including adjustment vertically, angular adjustment (e.g., in two axes), east-west adjustment, to follow slopes, to mate with piles that were driven out of spec, and the like. In various examples, the pile interface bracket can be installed with bolts, or other suitable coupler. However, in some embodiments, pile interface brackets can be absent. For example, some configurations can mount an actuator 101 directly to a post 104 without an adapter plate. In further embodiments, the bottom plate can be configured 410 to couple with other suitable structures that allow the bottom plate 410 to be coupled with the ground or other location.

In various embodiments, the bottom plate 410 can comprise a 90 degree angle, but in further embodiments, the angle of bottom plate 410 can be less than or greater than 90 degrees. Given the angle of the base plate 410, the bellows 1200 (see FIG. 12) can constantly be in a curved orientation, which can be desirable in some examples because it can provide greater stiffness and control through range of motion (ROM). In some embodiments, the bottom plate 410 can be manufactured using high-volume sheet metal fabrication methods (e.g., progressive die, transfer press, die casting, and the like). The bottom plate 410 can include stiffening features such as ribs, bosses, flanges, hems, and the like. Cap opening material can be bent in to mount to the bottom plate brace 412, which can save material and remove extra parts. The base plate 410 can be assembled using rivets, Tog-L-Tocs (BTM Corp.), spot welding, welding, bolts, or the like. The base plate 410 can comprise super washers (e.g., super washer 2700 as shown in FIG. 27) under a bellows contact patch to prevent extrusion through a bellow cap hole 415.

In some embodiments, the bottom plate 410 can be made of multiple pieces. For example, FIGS. 28a, 28b, 29a, 29b, 30a and 30b illustrate an example of a die cast multi piece bottom plate 410 in accordance with an embodiment. As shown in this example, the bottom plate 410 can be made out of two identical pieces that nest together, which in some examples can remove the need for a flexure stop given how pieces of the bottom late 410 mate together. Some embodiments can have parts that can have secondary operations for holes not parallel to a pull direction. Further embodiments can include ledges to help with installation and/or alignment. Still further embodiments can include features to improve actuator packaging for shipment to solar sites.

In further embodiments, one or both of the plates 410, 430 can comprise a "pillow plate," which can be formed via thin-gauge stampings bonded to create a stiff/strong shell structure. Some embodiments can include a reduced width of a bottom plate substructure compared to some examples discussed and shown herein. For example, a bellows contact patch can be maintained with a super washer 2700 as shown in FIG. 27. Another example can include a plate with a bow-tie shape (e.g., from a top view) and tapered ends from a side view, which can provide a moment optimized beam out of a rectangular piece of material. Additionally, in some embodiments, the bottom plate brace 412 can be absent. For example, a post 104 (e.g., disposed in the ground and connected to the actuator 101) can be used as a compressive element in the structure of the bottom plate 410.

FIG. 10 illustrates a perspective view of a top plate 430 including spreader brackets 497 extending from edges thereof. The top plate 430 is shown defining a pair of top plate coupling ports 431 which can be configured to couple with bellows 1200 (see, e.g., FIGS. 12 and 19-21) as described in more detail herein. For example, a bellows 1200 can couple with the top plate 430 at one end via a top plate coupling port 431 and the bellows 1200 can couple with a bottom plate coupling port 415 at a second end of the bellows 1200. Accordingly, a pair of bellows 1200 can be coupled between the top plate coupling ports 431 and the bottom plate coupling ports 415.

Figure 23A:
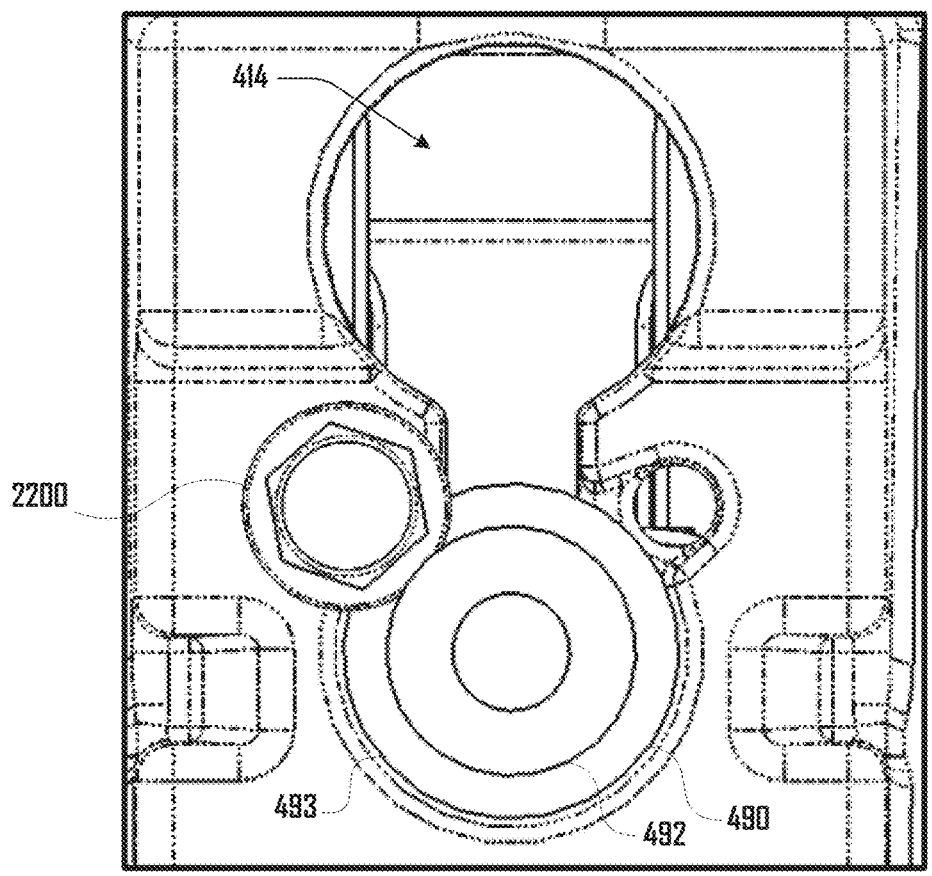
Figure 23B:
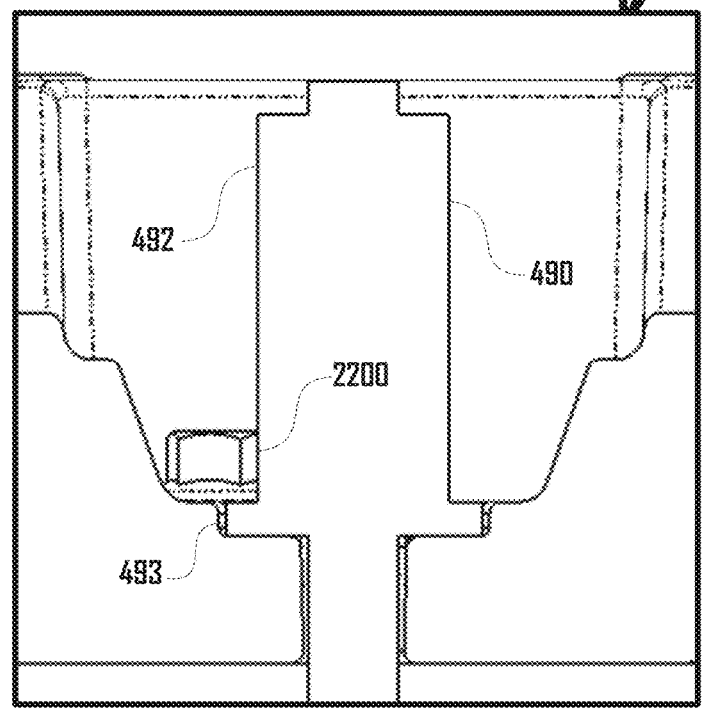

The top plate 430 can define a pair of top plate coupling slots 432, which can be configured to couple with and engage respective flexures 490 (see, e.g., FIGS. 4-7 and 17a) that extend between the bottom plate 410 and the top plate 430 as described in more detail herein. The top plate 430 can further comprise a pair of insert nuts 433 that extend from below the face of top plate 430 and are configured to couple with respective hub assemblies 470 (see, e.g., FIGS. 4, 5 and 15-18) as described in more detail herein. The insert nuts 433 can couple with a screw 2200 that fastens a flexure stop to the top plate 430 as shown in the examples embodiments of FIGS. 22, 23a and 23b.

As shown in various example embodiments, the top plate 430 can comprise a rectangular body having a pair of opposing sidewalls 434 and a pair of opposing endwalls 435. The spreader brackets 495 are shown having a pair of arms 496 that extend from a web 497, with the arms coupled to the sidewalls 434 of the top plate 430 via bolts 498.

Figure 26A:
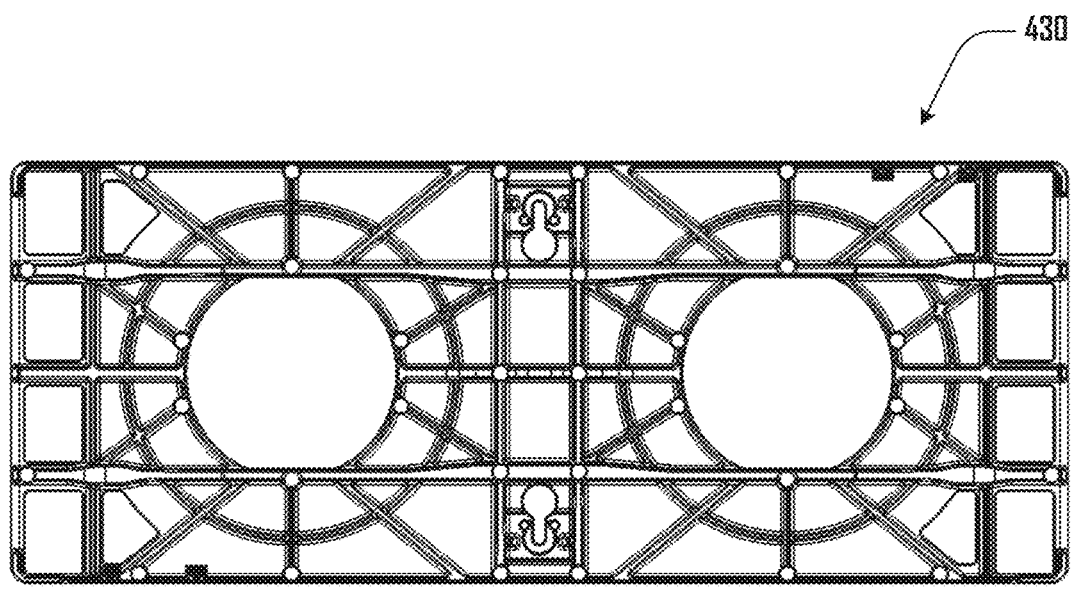
FIGS. 26a, 26b and 26c illustrate a die cast top plate in accordance with one embodiment.
Figure 26B:
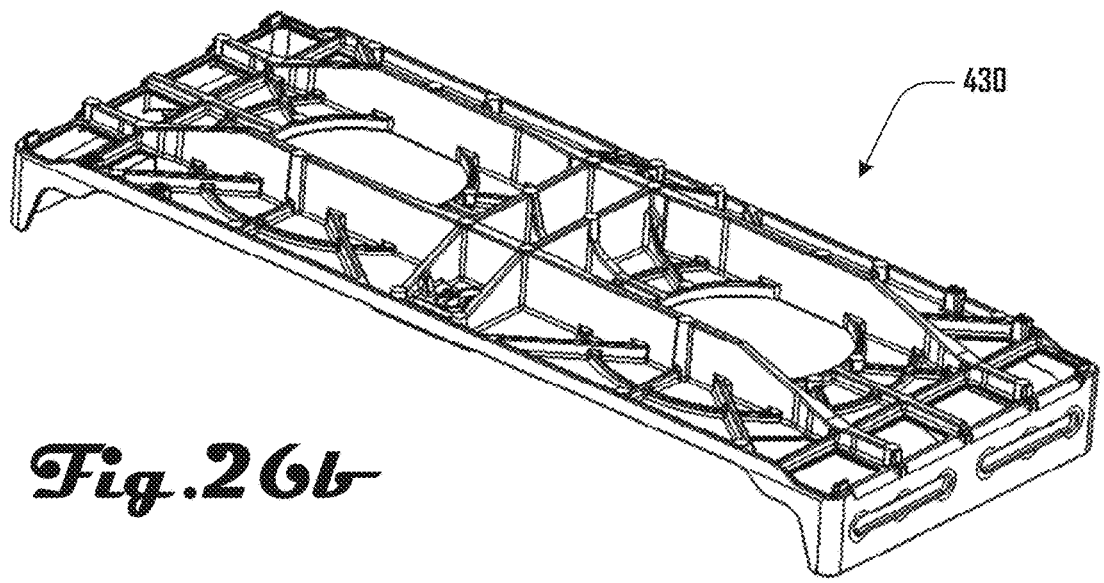
Figure 26C:
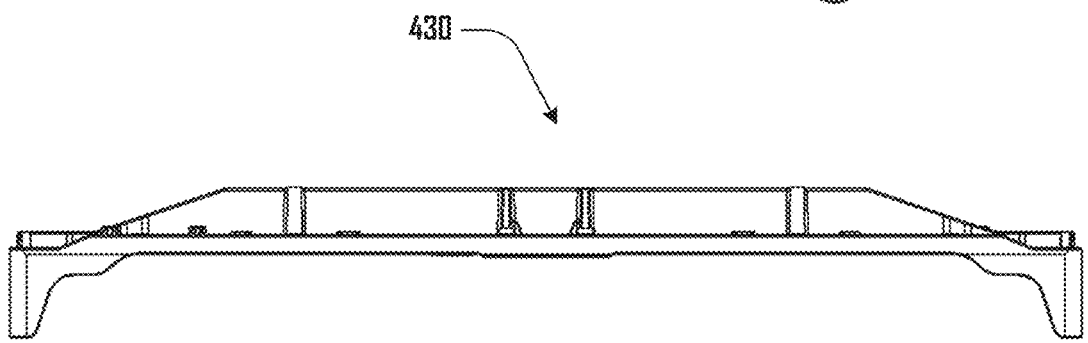
Figure 28A:
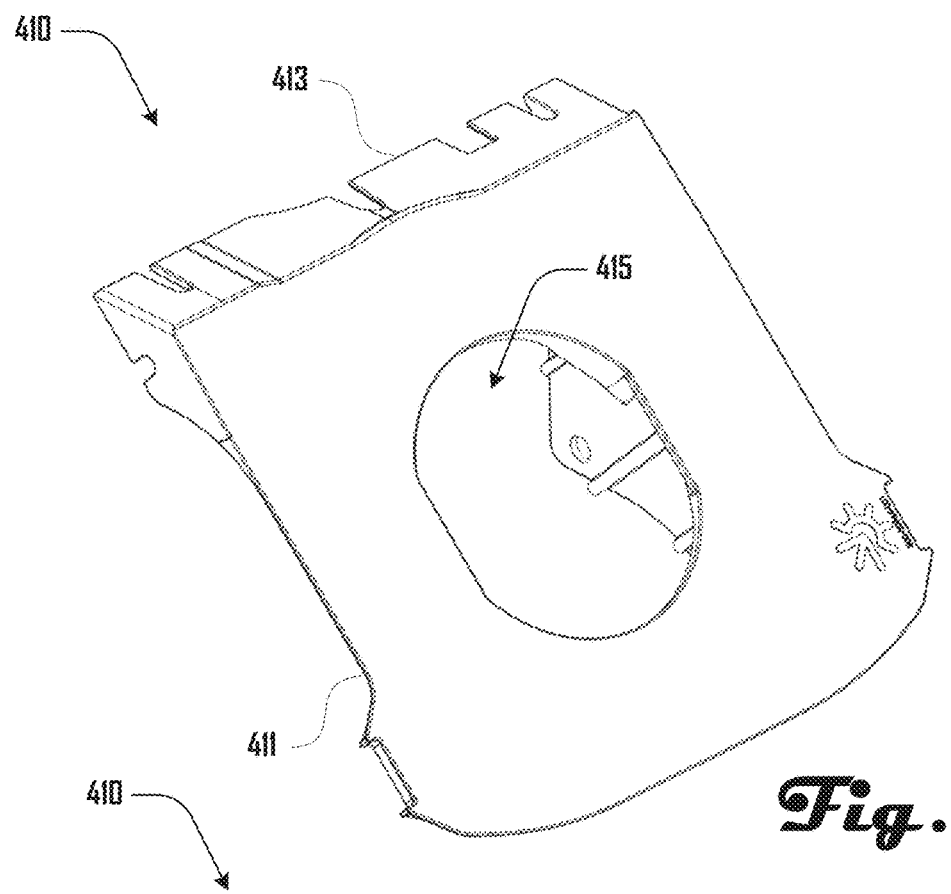
FIGS. 28a, 28b, 29a, 29b, 30a and 30b illustrate a die cast multi piece bottom plate of an actuator in accordance with an embodiment.
Figure 28B:
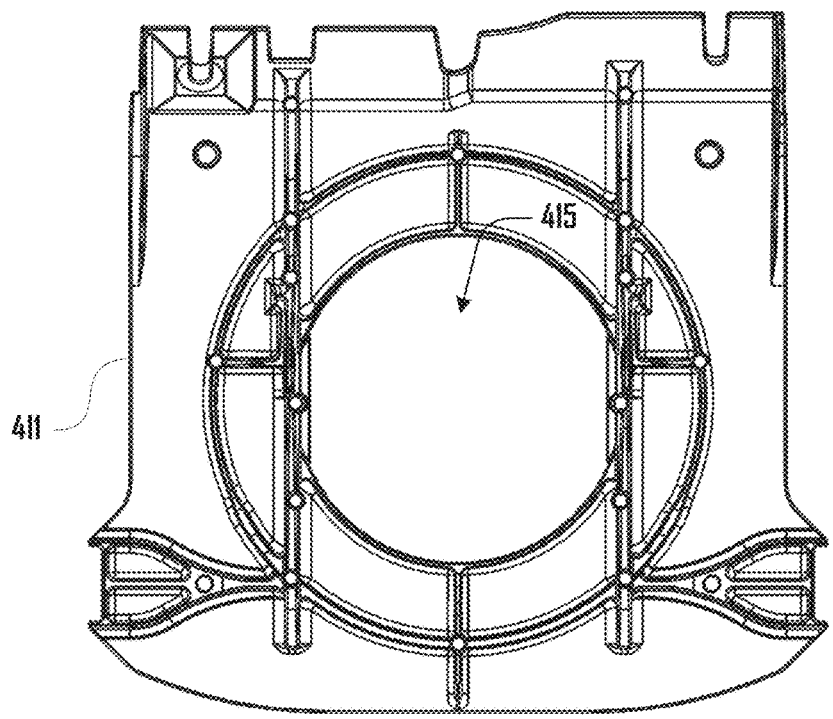
Figure 29A:
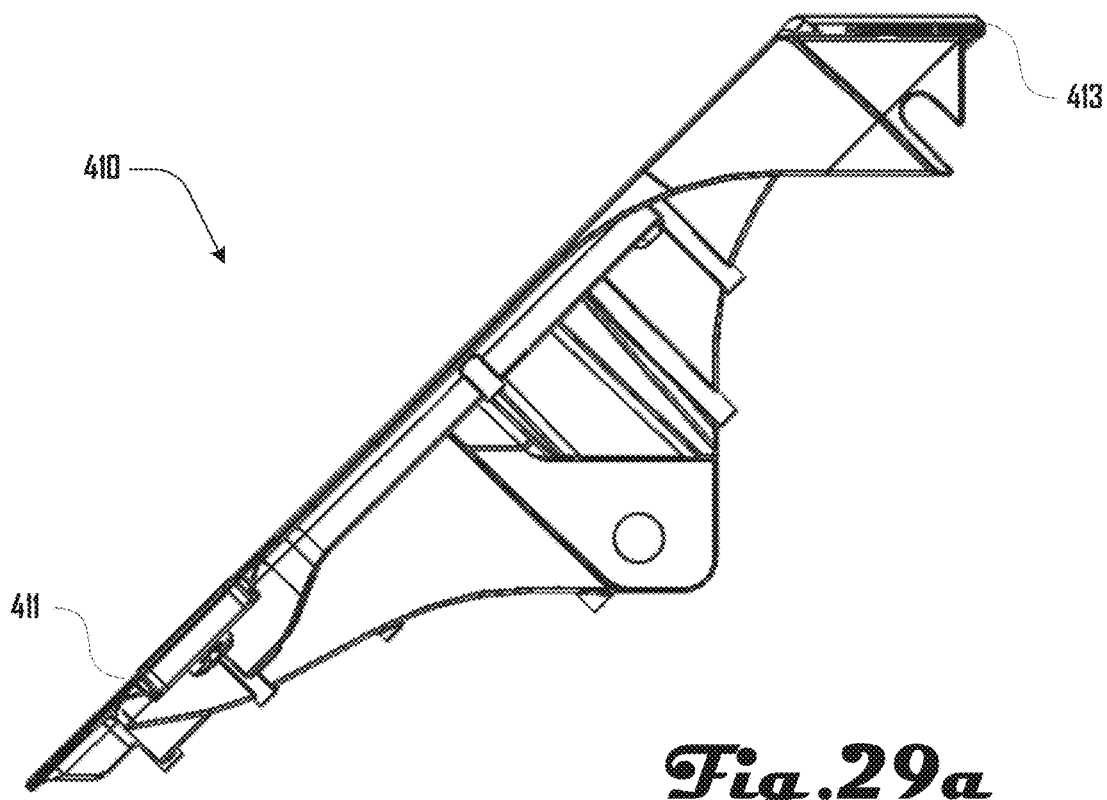
Figure 29B:
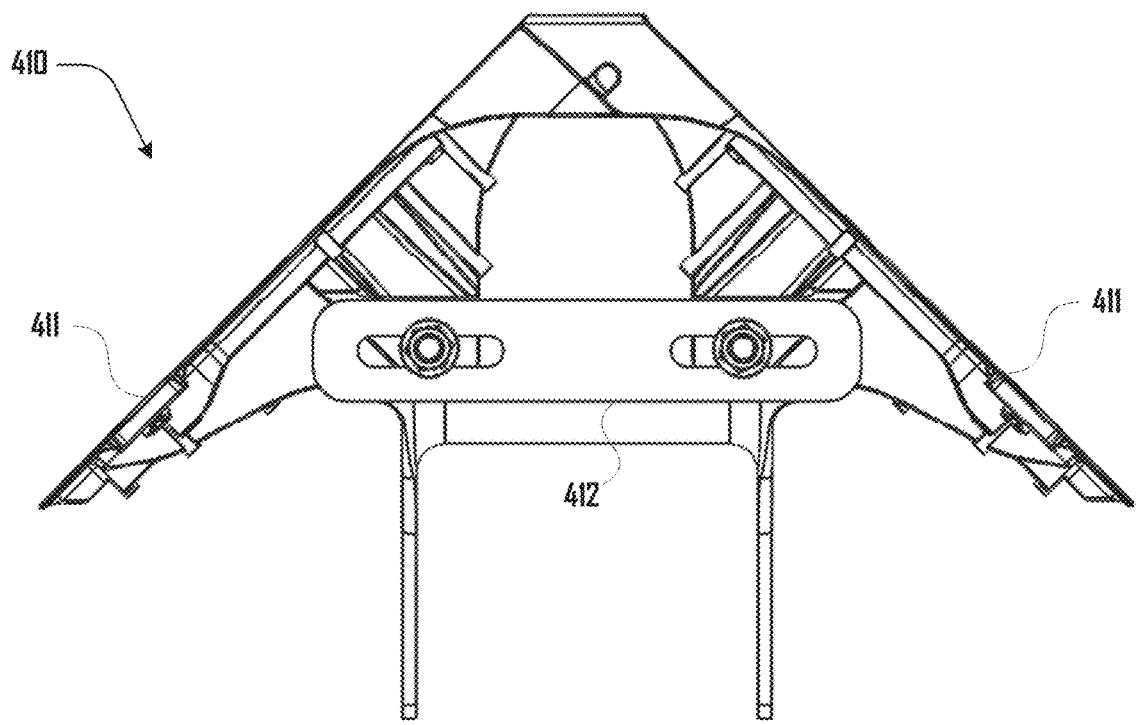
Figure 30A:
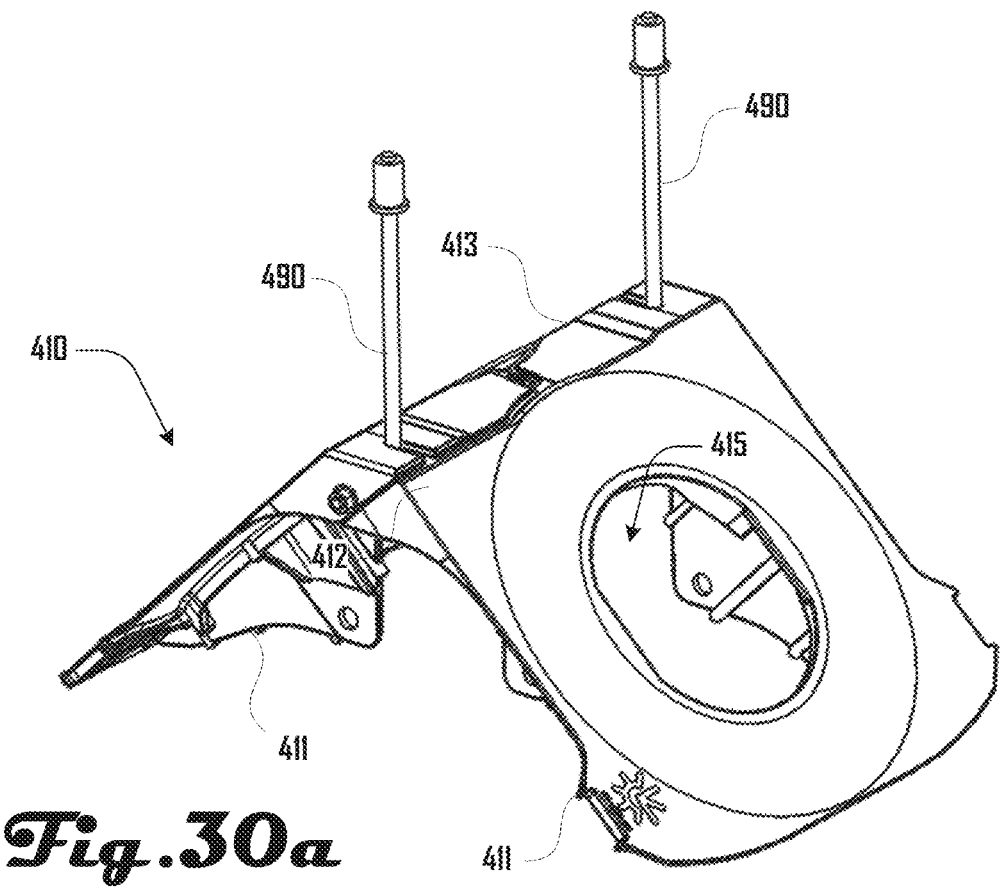
Figure 30B:
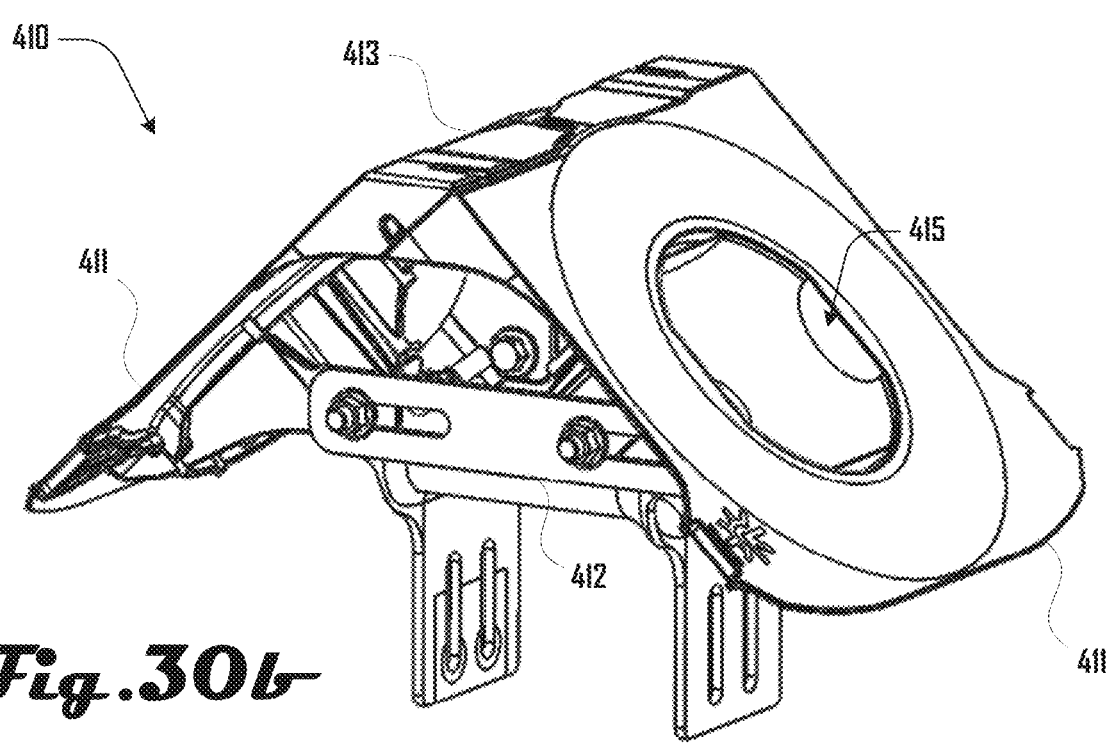
Figure 32B:
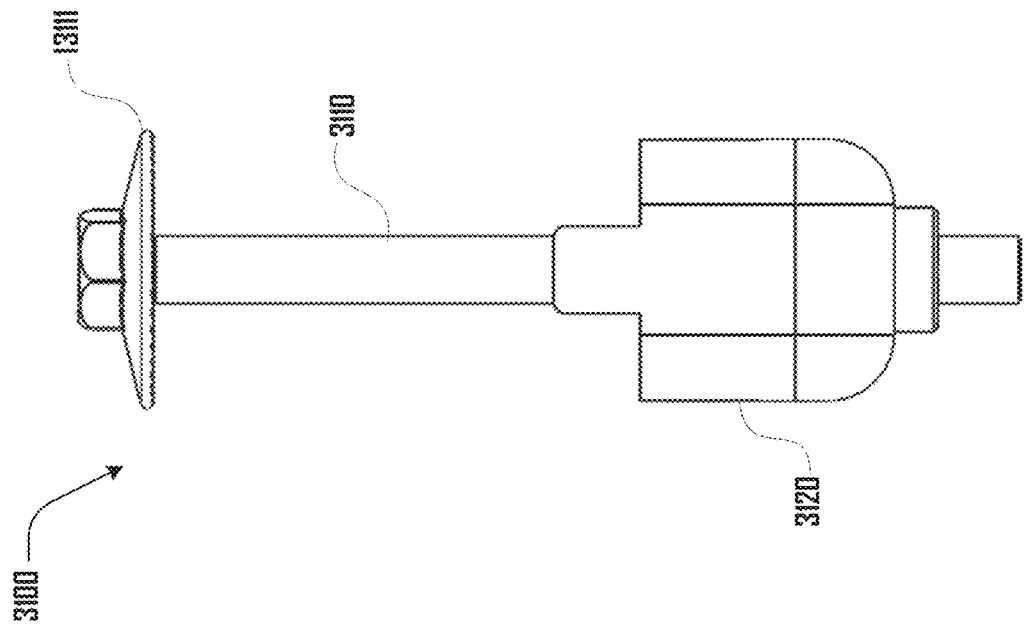
Figure 32A:
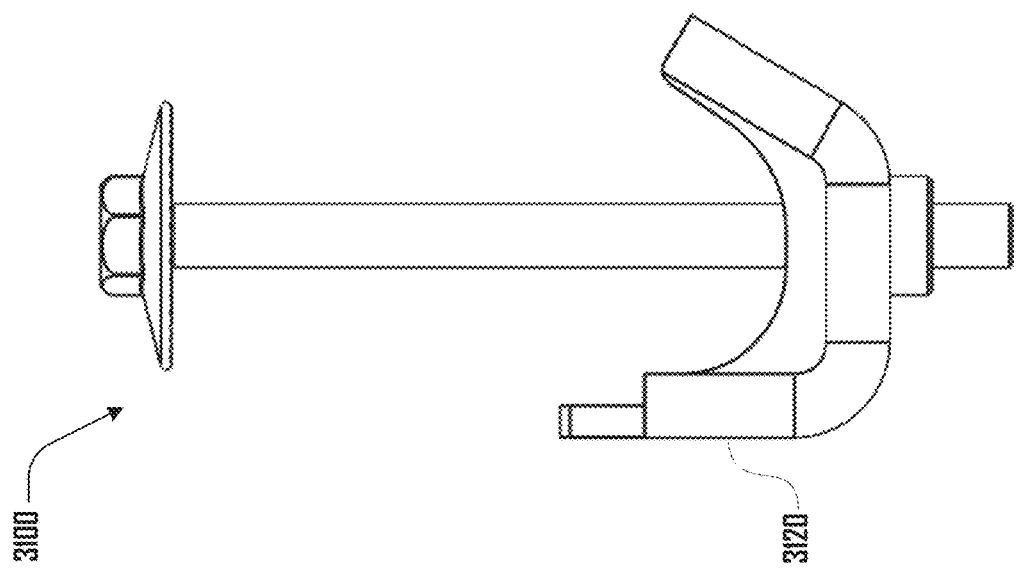

The top plate 430 can be made through any suitable process including laser cutting, sheet metal bending, stamping, die casting, and the like. In one embodiment, the top plate 430 can comprise die cast in aluminum. A die cast top plate 430 (e.g., as shown in FIGS. 26a, 26b and 26c) can comprise 3D features such as ribs, bosses, pockets and the like. Such features can help to optimize material utilization by creating structurally efficient sections and/or by putting material where it is needed and not putting material where it is superfluous.

The top plate 430 may also include features (e.g., holes, bosses, etc.) that can help to align or mount various actuator peripherals. One such feature can include a hole that accepts a zip tie that bundles and secures a pneumatic harness. Another such feature can include a boss that accepts a square nut and that can be used to mount an inclinometer or any other sensor to the actuator 101.

In various embodiments, the spreader brackets 495 can be generally U-shaped and configured to couple with portions of a solar tracker 100 such as rails 102 or the like (see FIGS. 1a, 1b and 2). Accordingly, having the spreader brackets 495 slidably coupled to the top plate 430 or having spreader brackets 495 of different sizes or having a different shape or size, can be desirable in some embodiments, so that the actuator 101 can couple with solar trackers 100 having different configurations (e.g., having rails 102 or Z purlins that are different widths apart). However, in some embodiments, spreader brackets 495 can be absent. For example, some configurations can extend the top plate 430 to the desired width for module mounting with spreader brackets 495 used when a wider profile is needed. In some examples, the top plate 430 can comprise mounting slots formed into the end wall to mate with the holes in a z-purlin, which can be fastened together with bolts.

FIGS. 11-14 illustrate bellows washers 450 in accordance with various embodiments. Specifically, FIG. 11 illustrates pairs of bellows washers 450 coupled to respective hub units 473 of a hub assembly 470. FIG. 12 illustrates a side view of a pair of bellows 1200 disposed within and supported by washers 450. FIGS. 13a and 13b illustrate respective side and top views of the washers 450 in accordance with an embodiment and FIG. 14 illustrates one example embodiment of a washer 450 that comprises inner and outer washer components 451, 455, which can overlap each other and can be bound together and with the central hub assembly 470 with fasteners 471 through aligned mounting holes 459.

As shown in these figures, the washers 450 comprise an outer washer component 451 that is generally U-shaped having a rounded front edge 452 from which a pair of branches 453 extend. The branches 453 in this example include a rim 454 on an outer edge of the branches 453 with the rim extending perpendicular to a planar face defined by the front edge 452 and the branches 453. The rim 154 can comprise mounting holes 459 configured to couple the outer washer component 451 to the inner washer component 455 and to the central hub assembly 470. For example, fasteners 471 (e.g., bolts, rivets, or the like) can extend through the mounting holes 459 and couple with the central hub assembly 470.

The inner washer component 455 can comprise a crescent-shaped head 456 and arms that terminate at rims 457 having mounting holes 459. As shown in FIG. 14, the separate inner and outer washer components 451, 455 can be configured to mate and form a washer 450. FIGS. 11, 12, 13a and 13b, for example, illustrate the inner and outer washer components 451, 455 in a mated configuration and forming respective bellows cavities 458 defined by the front edge 452 and branches 453 of the outer washer component 451 and the head 456 of the inner washer component 455.

In some examples, the inner and outer washer components 451, 455 can comprise bent, punched, or formed features. Such features include flanges, holes, windows, bosses cavities, or the like, which in some examples can aid in assembly by providing alignment or interface points for assembly tools, jigs or other fixtures. Inner and outer washer components 451, 455 can be made with any suitable process including laser cutting, sheet metal being, progressive die stamping, die casting, and the like.

As shown in FIG. 12, bellows 1200 are configured to extend through and engage with the bellows cavities 458 of the washers 450. As described in more details herein, the bellows 1200 can define convolutions defined by alternating valleys 1202 and peaks 1204 along the length of the bellows 1200. In various embodiments, the bellows cavities 458 of the washers 450 can be configured to engage with valleys 1202 of the bellows 1200 as shown in FIG. 12. In other words, the bellows cavities 458 can be sized to allow the washers 450 to reside within the valleys 1202 of the bellows 1200, but sized such that peaks 1204 cannot pass through bellows cavities 458 when the inner and outer washer components 451, 455 are in a mated configuration.

Accordingly, assembly of an actuator 101 can include inserting a bellows 1200 within the front edge 452 and branches 453 of an outer washer component 451 with the front edge 452 and branches 453 engaging the bellows 1200 within a valley 1202 of the bellows 1200. An inner washer component 455 can then be coupled with the outer washer component 451 (e.g., as shown in FIG. 14) such that the head 456 of the inner washer component 455 engages the bellows 1200 within the same valley 1202 of the bellows 1200 as the outer washer component 451. The washer 450 can then be coupled to a hub unit 473 via fasteners 471 through aligned mounting holes 459. A plurality of washers 450 can be coupled about one or more bellows 1200 in a similar way.

As shown in FIG. 12, in some embodiments, washers 450 can be disposed within every other valley 1202 along a length of the bellows 1200. However, further embodiments, can include any suitable alternative configurations of washers 450 engaging bellows 1200. For example, in some embodiments, washers 450 can engage every valley 1202, every second valley 1202, every third valley 1202, every fourth valley 1202, every fifth valley 1202, every tenth valley 1202, every twentieth valley 1202, or the like, along a length of a bellows 1200. Further embodiments can include other repetitive or non-repetitive patterns along a length of a bellows 1200.

Still further embodiments can include density of washers 450 within valleys 1202 increasing or decreasing along various lengths or portions of a bellows 1200. For example, washers 450 can be spaced at every valley 1202 at a first end of a bellows 1200 and the spacing can be expanded to every second valley 1202 and then to every third valley 1202 toward a second end. Alternatively, washer spacing can be more dense or sparse at a central portion of a bellows 1200.

As shown in FIG. 12, one example embodiment of an actuator 101 can comprise a pair of bellows 1200 on opposing sides of a hub assembly 470 with five washers 450 associated with each bellows 1200. Additionally, in this example, each hub unit 473 is shown associated with and coupled to a pair of washers 450 rigidly coupled on opposing sides of the hub units 473 and with the washers 450 of a given hub unit 473 being disposed at the same angle on the hub unit 473. Also, the angle between opposing washers 450 on a hub unit 473 is shown increasing from the bottom end of the hub assembly 470 to the top end of the hub assembly 470.

However, further embodiments can include various suitable alternative configurations. For example, other embodiments can include any suitable number of washers 450 associated with a given bellows 1200, including one, two, three, four, five, six, seven, eight, nine, ten, fifteen, twenty five, fifty, or the like. Also, while various embodiments can include the same number of washers 450 on the bellows 1200, some embodiments can include a different number of washers 450 on some bellows 120.

Additionally, while some embodiments include an angle between opposing washers 450 on hub units 473 increasing at different angles from the bottom end to the top end of the hub assembly 470, further embodiments can include the same angle for some or all of the washers 450. Also, some embodiments can include an angle between opposing washers 450 on hub units 473 decreasing at different angles from the bottom end to the top end of the hub assembly 470.

Figure 13A:
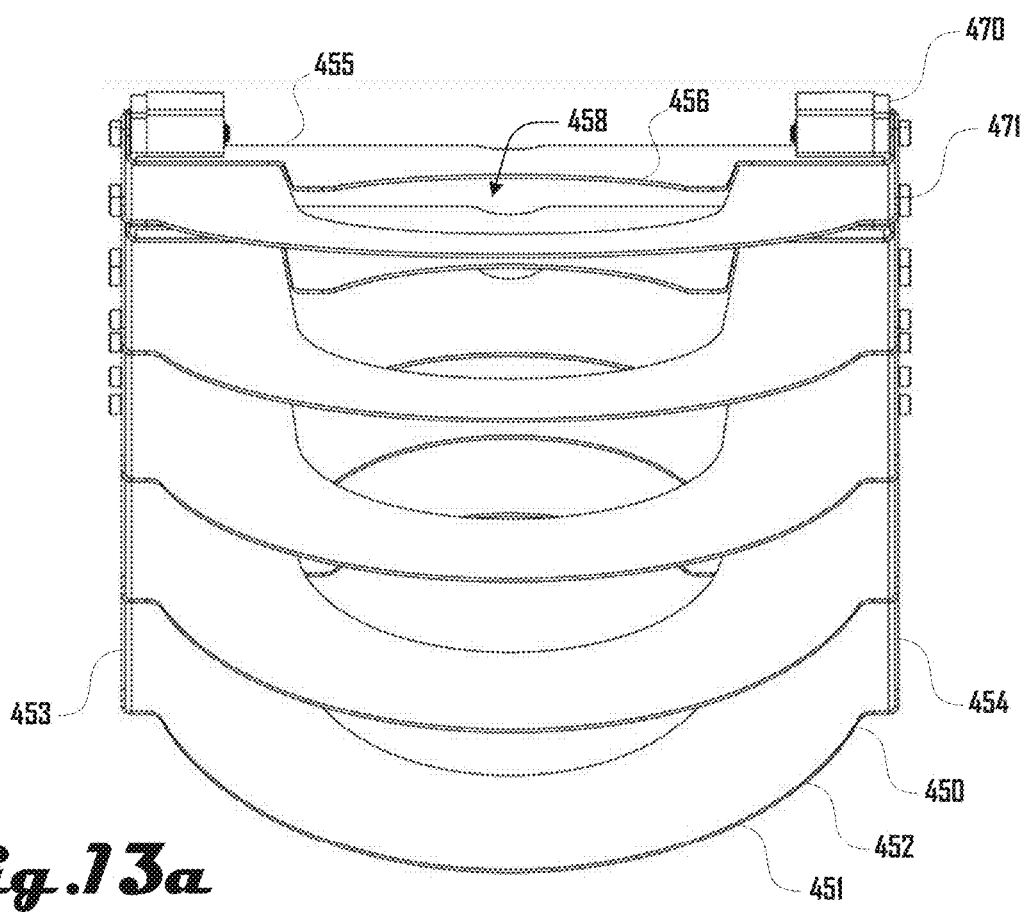
Figure 13B:
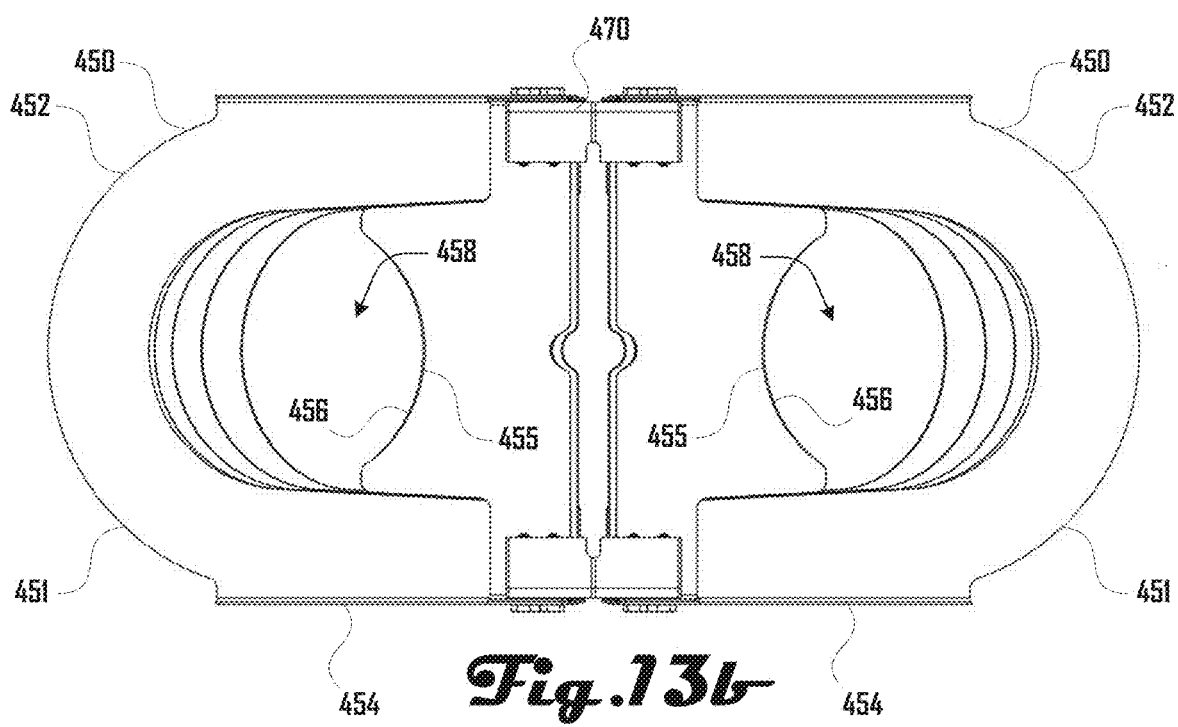

As shown in FIGS. 12 and 13b, the washers 450 of an actuator 101 can be disposed having a plane of symmetry $Z_W$ and $Y_W$ while in a neutral configuration N (see FIG. 2). However, in further embodiments, one or both of such planes of symmetry can be absent. Additionally, while the examples herein include embodiments of an actuator 101 having a pair of bellows 1200 associated with respective sets of washers 450, further embodiments can include any suitable number bellows 1200, including one, two, three, four, eight, or the like. Washers 450 can be absent in some embodiments or can be replaced with other suitable structures or constraints, including a rope, chain, wire, insulation, or the like.

Washers 450 can be laser cut, waterjet cut, turret punched, stamped, or the like. In some embodiments, washers 450 can be pre-galvanized, powder-coated, or the like, for corrosion resistance. In some examples, washers 450 can be defined by inner and outer washer components 451, 455, which can overlap each other and can be bound together and with the central hub assembly 470 with fasteners 471 through aligned mounting holes 459 as discussed herein. Inner and outer washer portions 451, 455 can comprise edge flanges 454, 457. Edge flanges 454, 457 can provide stiffness, which can be desirable for repeatable and high-load performance. Edge flanges 454, 457 can be any suitable height or length in various embodiments. Additionally, edge flanges 454, 457 or other suitable stiffening features can be incorporated, including ribs, bosses, cross breaks, and the like.

Additionally, mounting holes 459 can be disposed on these flanges 454, 457 and provide alignment features through which a fastener 471 can bind both washer components 451, 455 to the hub assembly 470. Inner washer portions 455 can feature a cutout at the center rear that can act as a flexure pass-through, which can be desirable for assembly, rework and replacement.

In further embodiments, the inner washer portion 455 and/or outer washer portion 451 can be defined by wire rope, a wire, or the like, instead of a flat plate as shown herein. In such embodiments, a wire rope inner washer can be configured to take loading directed towards the center of actuator 101. Other embodiments can include a wire rope-to-washer mechanical bonding using fingers formed from a sheet washer and interlacing and crimping onto wire rope. Further embodiments can comprise two-part steel washers with a split that is perpendicular to the split illustrated in the example embodiments of the drawings. In still further embodiments, the washers 450 can comprise formed stiffening features (e.g., ribs, bosses, cross breaks, and the like), which can increase material efficiency.

Some embodiments can comprise an inner washer portion 455 mated to an outer washer portion 451, instead of being mated to the hub assembly 470. For example, some embodiments can build the washer/bellow assembly before mating to the hub assembly 470, which can reduce assembly time, reduce tolerance stack issues relative to overlapping inner/outer portions, and the like. Further embodiments can comprise a two part adjustable length inner washer 455 formed by coupling (e.g., riveting) two parts together via thru holes that are arranged in a Vernier pattern. Still further examples can comprise a washer and spacer in one, which can include a washer that comprises two pieces of sheet material elastically bent at two different curvatures to form a thick center portion that serves as the spacer.

Figure 15:
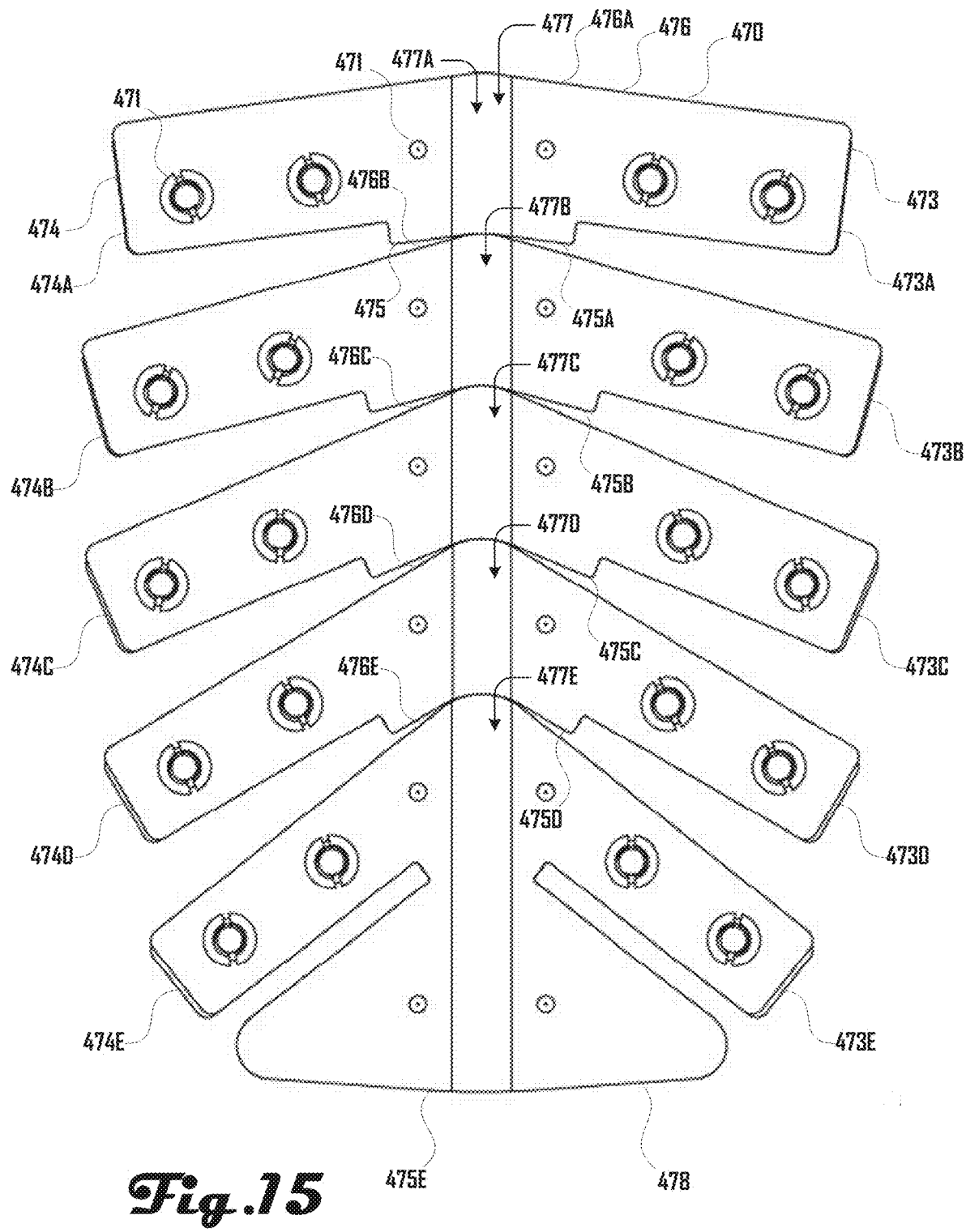
FIG. 15 illustrates a side view of a hub assembly in accordance with one embodiment.
Figure 16:
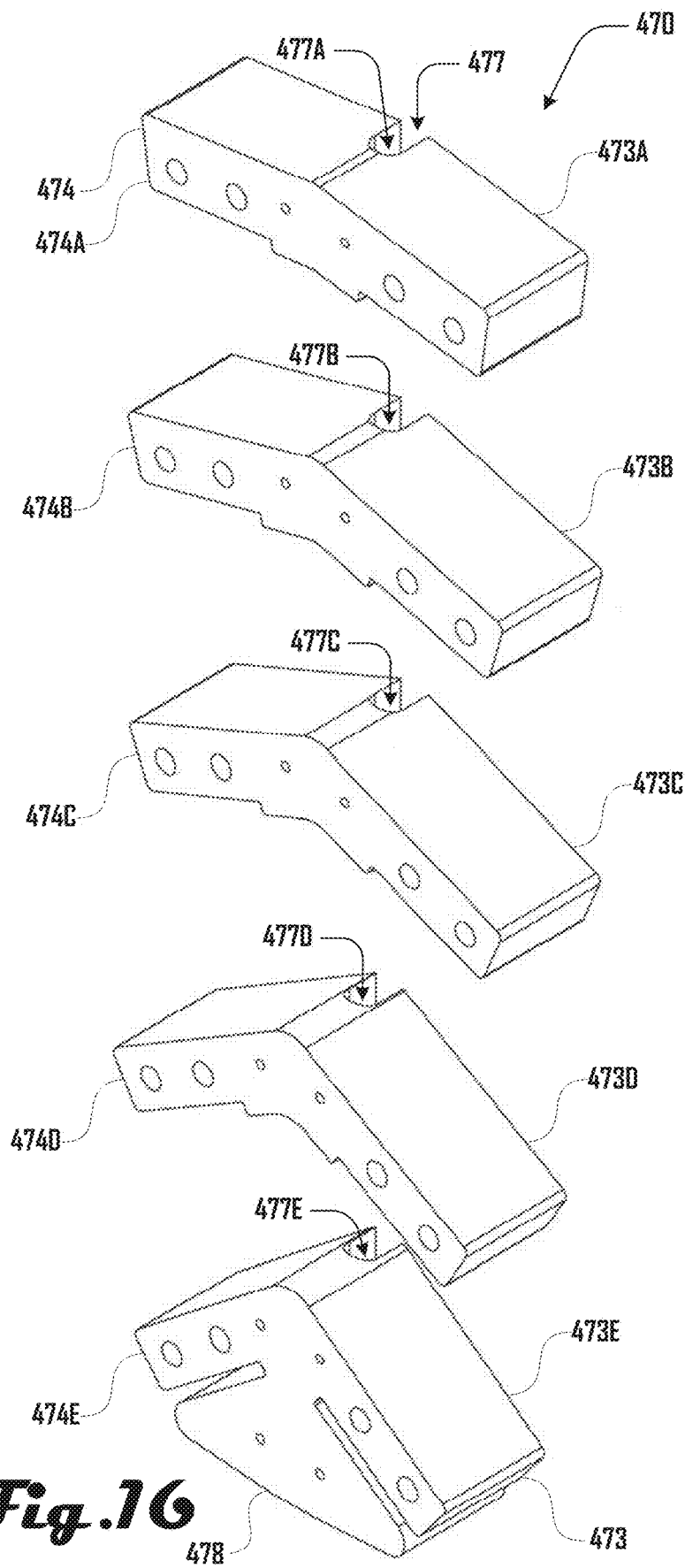
FIG. 16 illustrates an exploded side view of the hub units of a hub assembly being separated.
Figure 18:
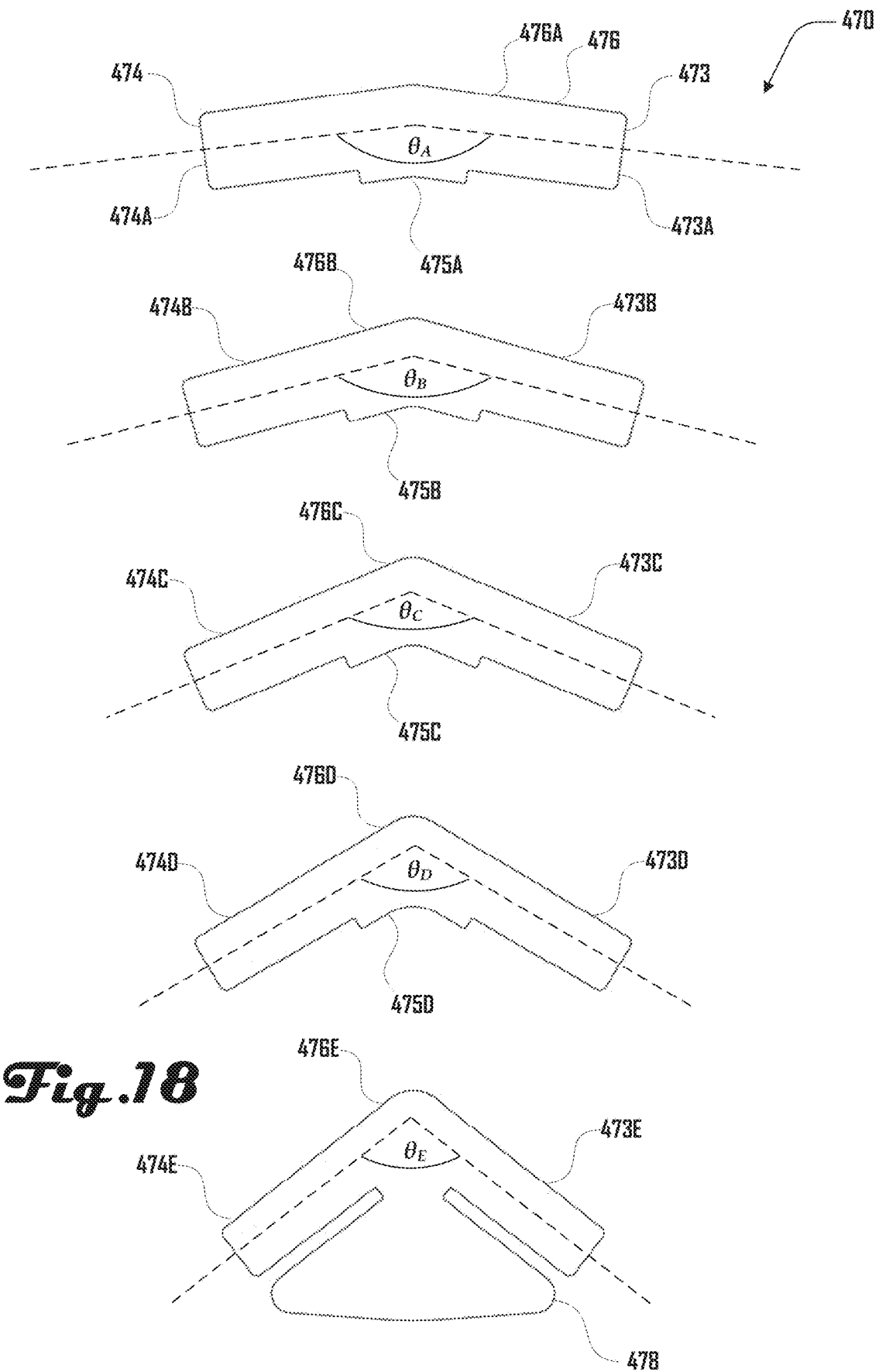
FIG. 18 is an exploded side view of a hub assembly with the body angles of the hub units illustrated increasing from the bottom to the top of the hub assembly.
Figure 24:
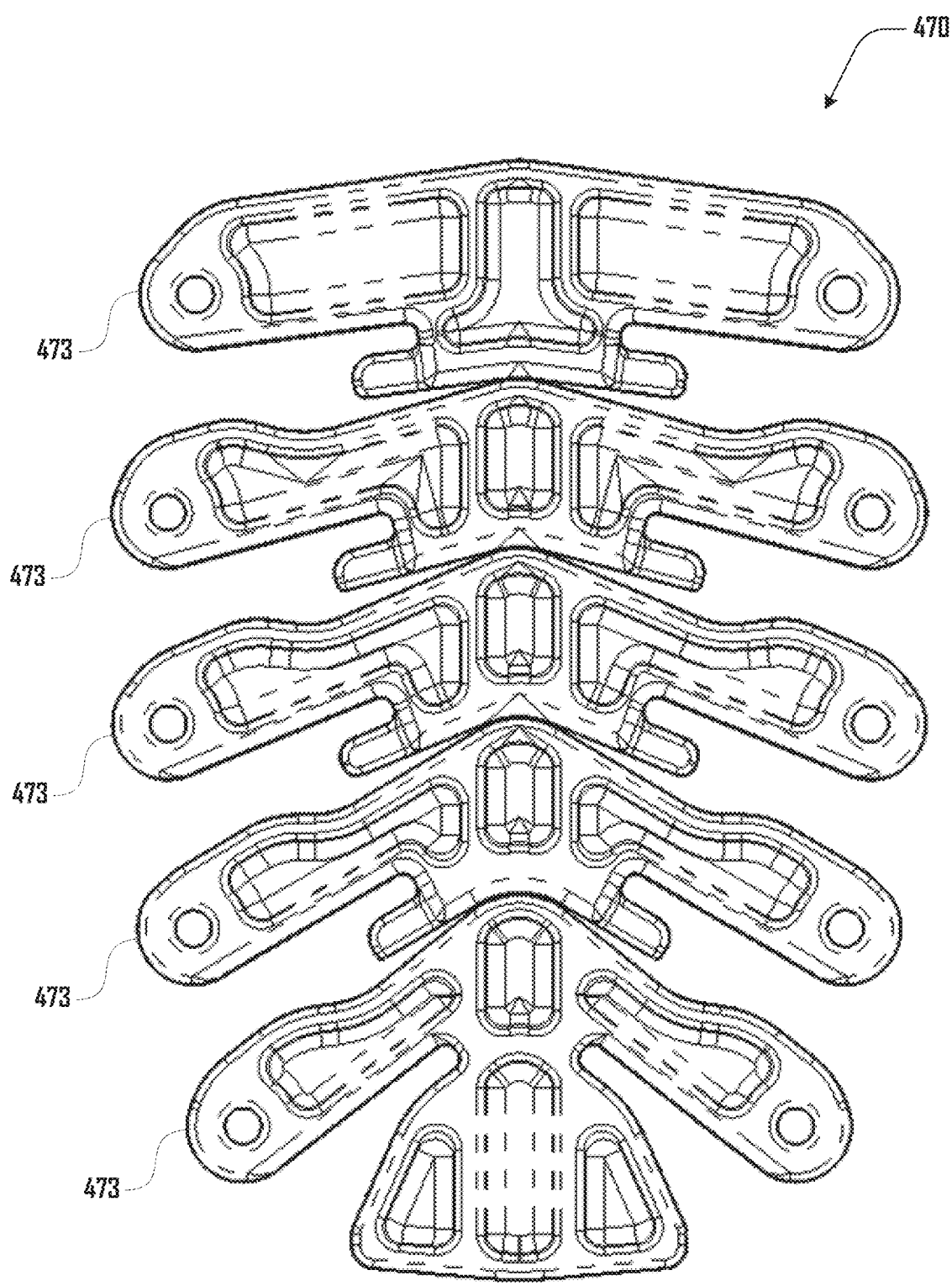
FIGS. 24 and 25 and illustrate a die cast hub assembly in accordance with another embodiment.
Figure 25:
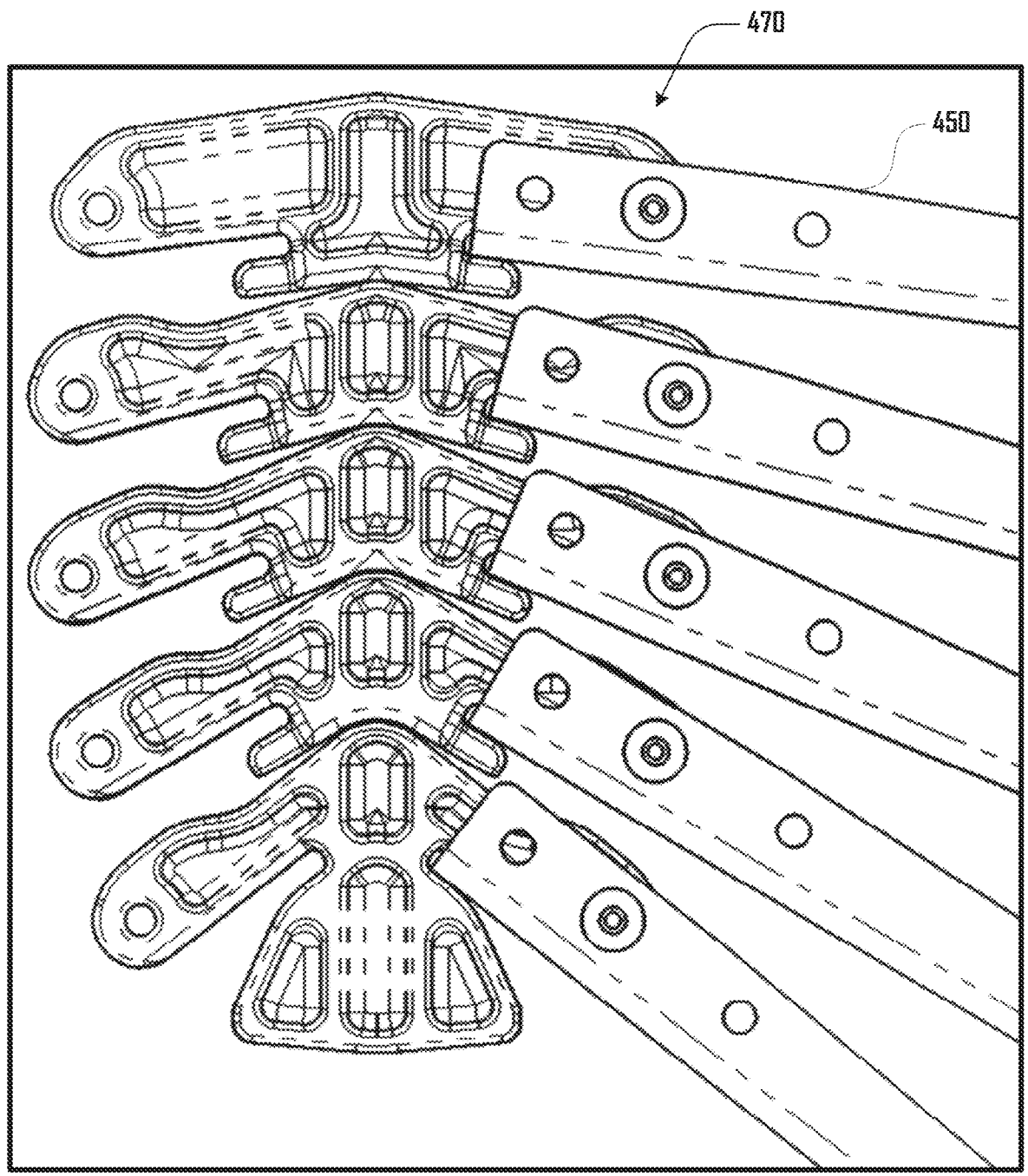

FIGS. 15, 16, 17a and 18 illustrate embodiments of a hub assembly 470 having a plurality of hub units 473, and FIG. 17b illustrates an example embodiment of a flexure 490 that can be associated with a hub assembly 470. More specifically, FIG. 15 illustrates a side view of a hub assembly 470 in accordance with one embodiment; FIG. 16 illustrates an exploded side view of the hub units 473 of a hub assembly 470 being separated; FIG. 17a illustrates an exploded view of the hub assembly 470 showing example configurations of the hub units 473 when the actuator 101 is in various configurations; and FIG. 18 is an exploded side view of a hub assembly 470 with the body angles of the hub units 473 illustrated increasing from the bottom to the top of the hub assembly 470. FIGS. 24 and 25 and illustrate a die cast hub assembly in accordance with another embodiment.

As shown in FIGS. 15 and 16, a hub assembly 470 can comprise a plurality of hub units 473, with this example embodiment having five hub units 473A, 473B, 473C, 473D, 473E. Each of the hub units 473 is shown comprising a pair of hub arms 474, a bottom end 475, a top end 476 and a flexure slot 477 extending between the top and bottom ends 475, 476. Additionally, the base hub unit 473E is shown comprising a hub base 478 at the bottom end 475E of the base hub unit 473E.

As illustrated in FIGS. 15, 16, 17a and 18, the hub units 473 can be separate bodies that are stacked to define at least a portion of the hub assembly 470. More specifically, as shown in these examples, a first hub unit 473A can be stacked on a second hub unit 473B, with the concave bottom end 475A of the first hub unit 473A engaging the convex top end 476B of the second hub unit 473B. The concave bottom end 475B of the second hub unit 473B can engage the convex top end 476C of the third hub unit 473C. The concave bottom end 475C of the third hub unit 473C can engage the convex top end 476D of the fourth hub unit 473D. The concave bottom end 475D of the fourth hub unit 473D can engage the convex top end 476E of the fifth hub unit 473E.

Additionally, the flexure slots 477A, 477B, 477C, 477D, 477E of the hub units 473A, 473B, 473C, 473D, 473E can be aligned such that a flexure 491 can be disposed and extend within the flexure slots 477 from the top end 476A of the first hub unit 473A to the bottom end 475E of the fifth hub unit 473E (e.g., as shown in FIG. 5). For example, as shown in FIG. 17b, in some embodiments, a flexure 490 can comprise a line 491 that extends between a pair of flexure stops 492 that comprise flexure washers 493. As shown in this example, the width of the line 491 can be smaller than the width of the flexure stops 492 and the flexure washers 493. The width of the line 491 can be configured to correspond to a width of the flexure slots 477 such that the line 491 can be disposed and extend within the flexure slots 477 from the top end 476A of the first hub unit 473A to the bottom end 475E of the fifth hub unit 473E.

Hub units 473 can be fabricated in any suitable manner. For example, in one embodiment, a plastic injection molded hub shell can be paired with a metal insert or cladding. The plastic shell can act as an interface between adjacent hub units 473 as well and/or as an interface between the hub units 473 and a flexure 490. The shell can comprise a material that has a small coefficient of friction and/or desirable wear properties. Metal cladding can be inserted into a pocket or other feature molded into the plastic shell. The cladding can act as a structural component and can bear loads applied by bellows 1200 (see FIG. 12) to the washers 450 and can transfer such loads through the hub units 473 and ultimately to the flexure 490.

In one embodiment, the hub units 473 can comprise die cast in aluminum. Hub units 473 can bear on one another while retaining structural integrity when subjected to applied loads. Hub units 473 can be designed in some examples so that each wing of a mating washer is only secured by a single fastener, be it a screw, rivet or the like.

As shown in FIGS. 4-7 the flexure stops 492 can engage and couple with the top and bottom plates 430, 410. For example, flexure stops 492 can extend through and engage cap coupling slots 414 of the bottom plate 410 (see FIGS. 8a, 9a and 9b) and can extend through and engage coupling slots 432 of the top plate 430 (see. FIG. 10).

For example, in some embodiments, the flexure stops 492 can be configured to pass through a first portion of the coupling slots 414, 432 and then be held (i.e., be configured to not pass through a second portion of the slots 414, 432. Additionally, as shown in FIGS. 4, 5 and 7, a stop tab 495 can further secure and hold the flexure stops 492. In further embodiments, the line 491 can pass through the coupling slots 414, 432 and some or all of the flexure stops 492 (e.g., the flexure washers 493) can be coupled with the line 491 to secure the line 491.

Flexure stops 492 for the bottom and top plates 410, 430 can be different, identical or interchangeable. In some examples, the flexure stop 492 includes a single fastening hole. In further examples, the flexure stop comprises an open ended slot that acts as a flexure capture. A rivet or nut in the top plate 430 and/or bottom plate 410 can provide a fixed feature to fasten to.

In some embodiments, a separate flexure stop 492 can be absent. For example, a flange on a flexure swage can be seated in a depression feature on either of a top or bottom plate 410, 430. A fastener, a self-tapping screw, cotter pin or likewise, can bind the flexure swage to the seating feature.

The line 491 can be made of various suitable materials, including a metal, plastic, Spectra, composite material, or the like. For example, in some preferred embodiments, the line 491 can comprise a metal wire rope. Additionally, in various embodiments, it can be desirable for the flexure 490 to be configured to be bendable and flexible laterally and/or inextensible along the length of the flexure 490.

In some embodiments of an actuator 101 having an angled bottom plate 410 and/or top plate 430, the lengths of the flexure 490 can be shorter than in configurations having a flat top and bottom plate 410, 430, which can be desirable for providing a shorter moment arm, better dead load/active load performance, and the like. The flexure 490 can be coated or un-coated. In some examples, a swage or termination of the flexure 490 can be fitted with a rubber cap to cover an exposed wire rope. Some embodiments can include a flange turned into a flexure crimp, which can eliminate the need for floating washers in some examples, while maintaining a large load spreading bearing surface on one or both terminations of the flexure 490. In further embodiments, the flexure 490 can be defined by a chain, or other suitable structure integrated with the hub assembly 470. Still further embodiments, can comprise four flexures 490 per actuator 101 creating a four-bar-linkage-like arrangement, which can move the virtual pivot above the top plate 430.

For example, FIG. 17a illustrates an example of a flexure 490 bending and flexing in response to movement of hub units 473. In the example of FIG. 17a, the hub units 473 are shown spaced apart for purposes of illustration, but in various embodiments, the hub units 473 can be stacked as shown, for example, in FIG. 15. Returning to FIG. 17a, a hub assembly 470 is shown in a neutral configuration N and in left and right bend configuration L, R. For example, the neutral configuration N can be a configuration where the flexure 490 is linear and unbent or flexed. Additionally, the hub assembly 470 can be aligned linearly and have a plane of symmetry that is coincident with the centrally located flexure 490. In various embodiments, the neutral configuration N of FIG. 17a can be present when a solar tracker 100, for example as shown in FIG. 3, is in the neutral configuration N.

Returning to FIG. 17a, the hub units 473 can be configured to shift to the left and right L, R, which causes the flexure 490 to flex along the length of the flexure 490. For example, as described herein, bellows 1200 of an actuator 101 (see FIG. 12) can be inflated and/or deflated which can cause the bellows 1200 to expand and/or contract along a length of the bellows 1200 and cause movement of washers 450 surrounding the bellows 1200. Such movement of the washers 450 can in turn cause rotation, movement or pivoting of the hub units 473 of the hub assembly 470 as shown in FIG. 17a. For example, such pivoting of hub units 473 of the hub assembly 470 can be generated when a solar tracker 100 is moving between a neutral position N and the maximum tilt positions A, B as shown in FIG. 2.

Additionally, while FIG. 17a illustrates the hub units 473 of the hub assembly 470 being spaced apart, where the hub units 473 are stacked and engaged via respective bottom portions 475 and top portions 476, such engagement can provide a moving interface between respective hub units 473 that allows the hub units 473 to tilt while staying engaged. Accordingly, respective concave and convex configurations of the bottom and top portions 476, 475 of the hub units can be desirable to provide for such a movable interface.

Turning to FIG. 18, in some embodiments, the arms 474 of the hub units 473 can be disposed along axes that having an angle therebetween. For example, as shown in FIG. 18, a first hub unit 473A, can have arms 474A disposed at an angle of $\theta_A$, a second hub unit 473B, can have arms 474B disposed at an angle of $\theta_B$, a third hub unit 473C, can have arms 474C disposed at an angle of $\theta_C$, a fourth hub unit 473D, can have arms 474D disposed at an angle of $\theta_D$, and a fifth hub unit 473E, can have arms 474E disposed at an angle of $\theta_E$. FIG. 18 illustrates the angles of the arms 474 becoming smaller from the first hub unit 473A to the fifth hub unit 473E. In other words angle $\theta_B$ is smaller than angle $\theta_A$, angle $\theta_C$ is smaller than angle $\theta_B$, angle $\theta_D$ is smaller than angle $\theta_C$, and angle $\theta_E$ is smaller than angle $\theta_D$. Additionally, angle $\theta_A$ is shown being less than 180°.

Further embodiments can have other suitable configurations, however. For example in some embodiments, some or all of the angles θ of the arms 473 can be the same. Additionally, in other embodiments, the angles of the arms 473 can increase moving downward, can be increasing moving toward a center, can be decreasing toward a center, or can be alternatingly increasing or decreasing. In some embodiments, all angles θ of the arms 473 can be within the range of 180° and 90°. In further embodiments, all angles θ of the arms 473 can be within the range of 180° and 0°.

In various embodiments, and as shown in FIGS. 4, 5, 11, 13a and 13b, an actuator 101 can comprise a pair of opposing hub assemblies 470 that both extend between the top and bottom plates 410, 430 parallel to axis $Z_A$ (FIG. 5) and centrally aligned along axis to axis $X_A$ (FIG. 6). Accordingly, in various embodiments, the hub assemblies 470 can comprise an axis of symmetry that is coincident with axes $Z_A$ and $X_A$. Additionally, the actuator 101 and portions thereof, including the bottom plate 410, top plate 430, washers 450, flexures 490 and the like can comprise an axis of symmetry that is coincident with axes $Z_A$ and $X_A$.

Also, as shown in FIGS. 11 and 13b, the hub assemblies 470 can define flexure slots 477 that open inwardly toward a central slot 1110 between respective pairs of opposing washers 450. However, in further embodiments, flexure slots 477 can open in any suitable direction (e.g., outwardly) and may or may not have an opposing orientation. Additionally, in some embodiments, the flexure slots 477 can be substantially closed and defined by holes extending through the hub units 473. In further embodiments, the flexure slots 477 can take the form of a constant section channel or can vary in width along the length of the flexure slots 477. In one embodiment, a flexure channel can have an hourglass shape, where the center of the channel retains a relatively narrow width and the channel tapers to widen at the extreme ends of the channel. Various embodiments can be configured to reduce stress on a hub flexure interface, and/or to reduce abrasion, fatigue failure, and the like.

Furthermore, in some embodiments, there can be any suitable number of hub assemblies 470, including one, two, three, four, five, six, seven, eight, or the like. Also, while various examples herein discuss each hub assembly 470 being associated with one flexure 490, in further embodiments, one or more hub assembly 470 can be associated with a plurality of flexures 490.

Additionally, while various examples herein relate to hub assemblies 470 having five hub units 473, further embodiments can include one or more hub assembly having any suitable number of hub units 473, including one, two, three, four, five, six, seven, eight, nine, ten, fifteen, twenty five, or the like. Also, a given hub unit 473 can be associated with any suitable number of washers 450 or may not be associated with any washers 450 in some embodiments. Accordingly, the examples herein having each hub unit 473 associated with a pair of opposing washers 450 should not be construed to be limiting on the wide variety of alternative configurations that are within the scope and spirit of the present disclosure.

In some examples, the actuator hub assembly 470 can include a plastic spacer and metal cladding. The plastic spacer can be waterjet cut, machined, injection molded, extruded, or the like. In various embodiments, the actuator hub assembly 470 can be assembled using rivets, bolts, screws, and the like. With rivets, in various embodiments, fastener part count can be halved and assembly complexities can be eliminated without need for an insert nut. In further embodiments, portions of the actuator hub assembly 470 can be made of plastic, which can comprise or be coated in any suitable polymer, including HDPE, nylon, Acetal, PTFE, a rate-stiffening polymer or the like.

Metal cladding can be stamped, laser cut, waterjet cut, punch pressed, or the like. In some embodiments, cladding can be pre-galvanized, hot-dip galvanized, powder coated, painted, or the like, to provide corrosion protection. In various embodiments, cladding can comprise any suitable number of layers, including one, two, three, four, five, six, or the like. The actuator hub assembly 470 can keep each set of washers 450 a specific distance away and washer spacing off-center can be tuned based on geometric modeling and empirical data. The hub assembly 470 can maintain the angle of each set of washers 450, with the washer angle between pairs of washers 450 decreasing from the top hub unit 473A to the bottom hub unit 473E as discussed herein. In some embodiments, the actuator hub assembly 470 provides structure under heavy compressive external loads and depressurization. The hub assembly 470 can support non-trivial internal compression loads caused by bellows 1200 pressurization in various embodiments.

Hub units 473 can have various suitable fasteners. For example, some embodiments can include a single fastener per side, which can be desirable because it can reduce fastener hardware, and enable easier manual or automated assembly. Additionally, some embodiments can comprise a thin cladding or skin. Also, some embodiments can comprise a hub-flexure interface rather than washer-flexure interface, which can be desirable because such a configuration can provide more bearing area and can avoid washers 450 wearing into the flexure.

Figure 19:
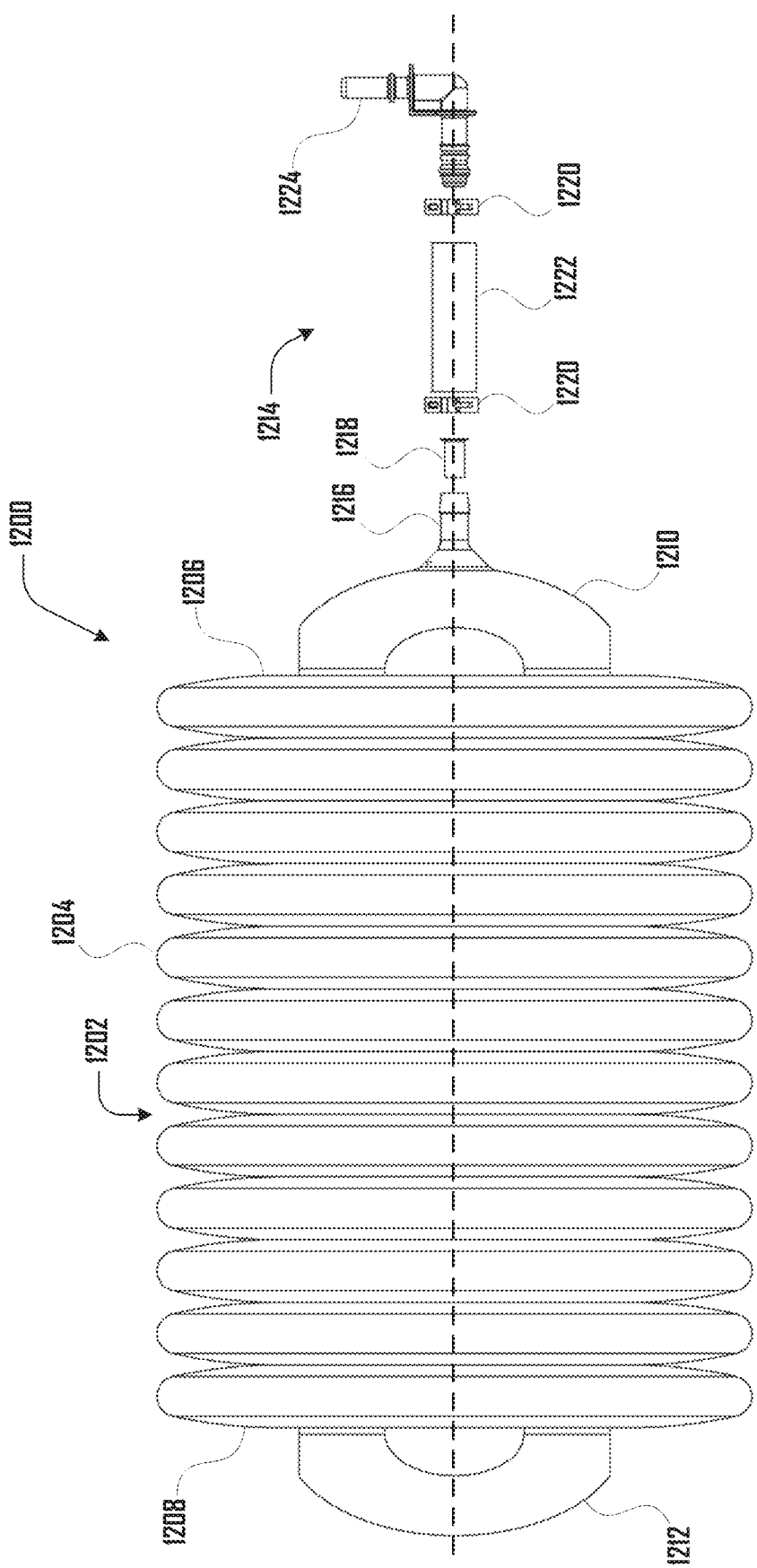
FIG. 19 shows an example of a nozzle assembly that comprises a port of the first cap and a tube support.
Figure 20:
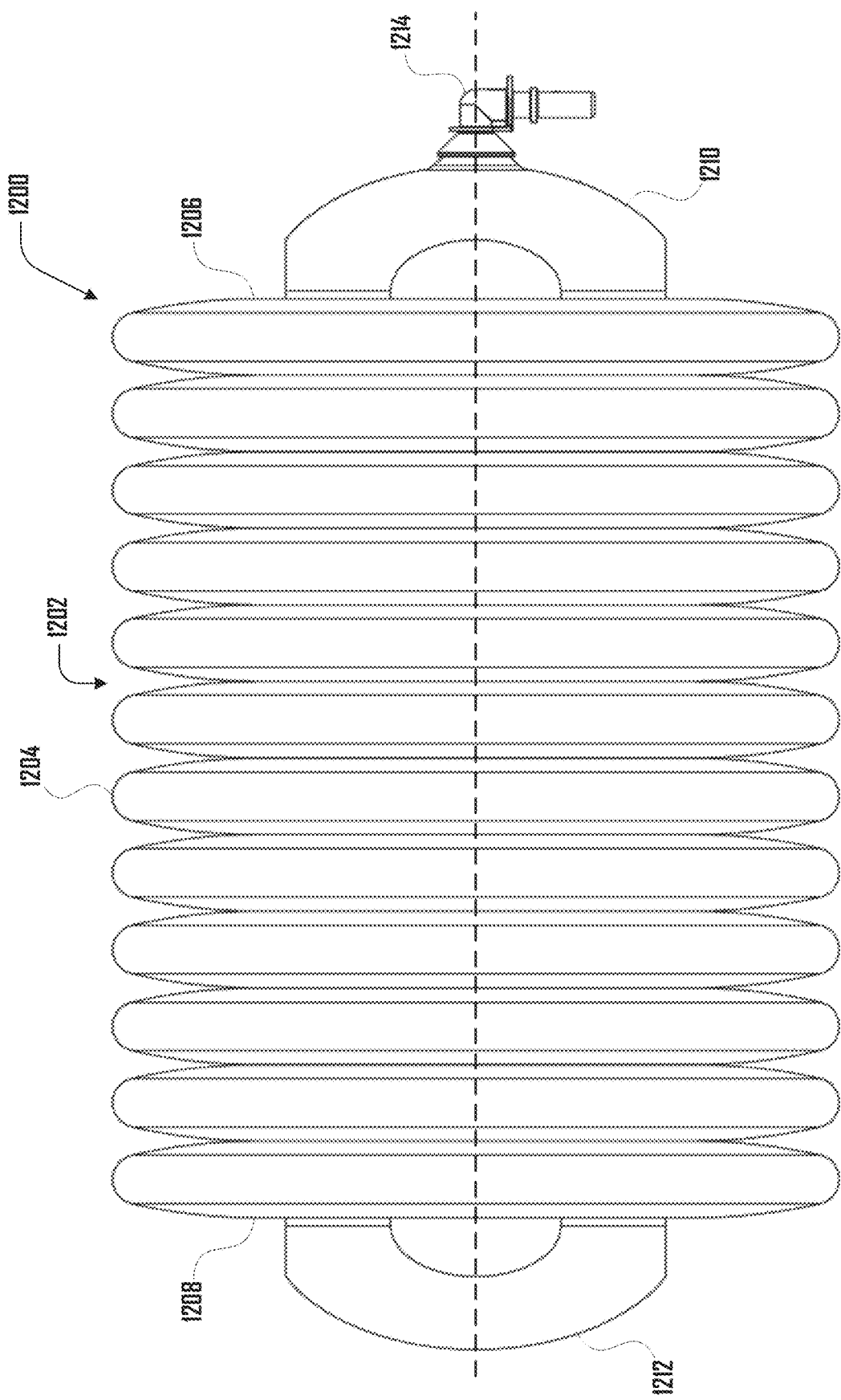
FIG. 20 illustrates another example of a nozzle assembly that can be coupled to a bellows cap.
Figure 21:
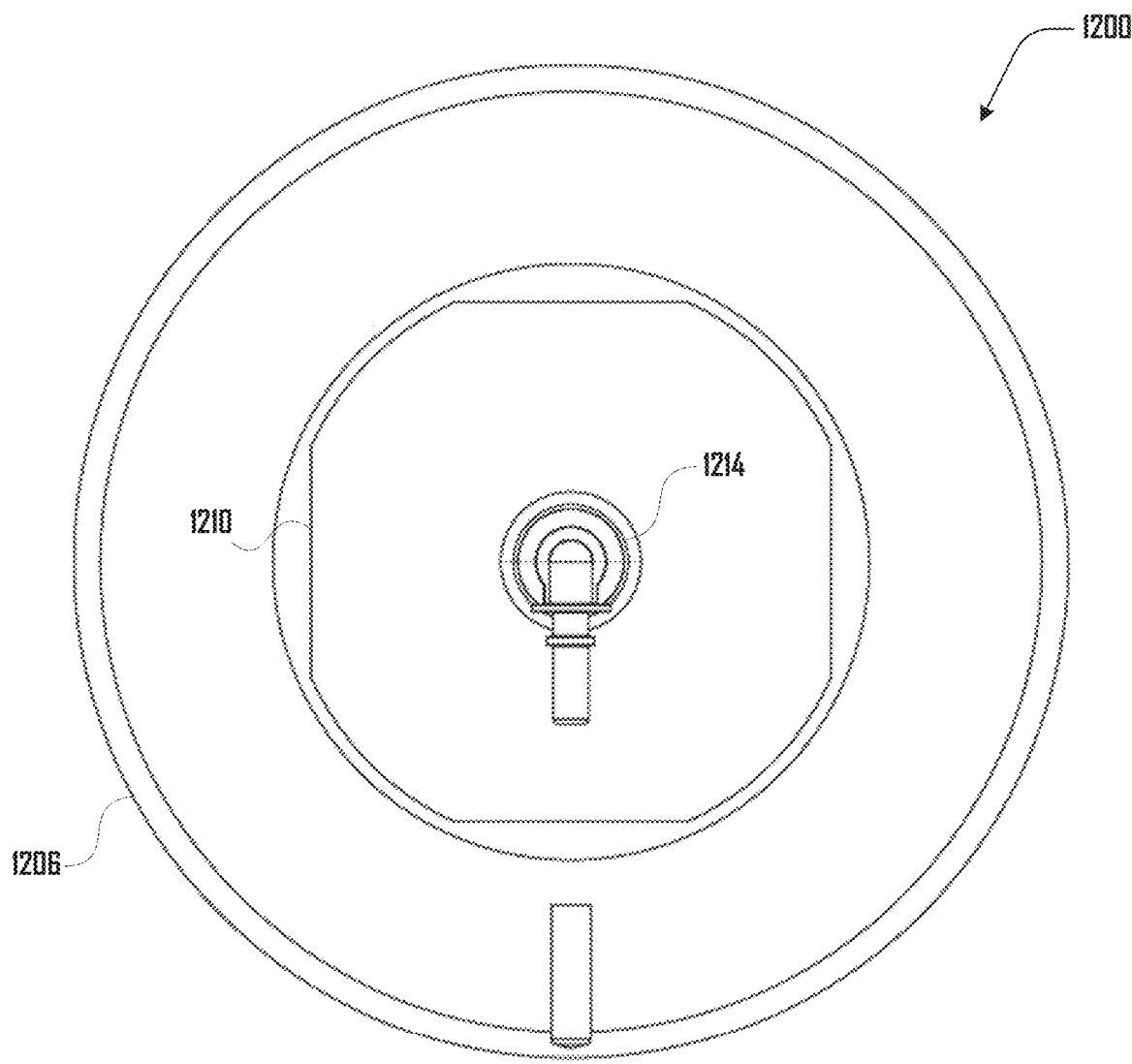
FIG. 21 is a top view of a bellows in accordance with an embodiment.

FIGS. 19-21 illustrate examples of bellows 1200 in accordance with some embodiments, which can comprise a portion of an actuator 101 as shown in FIG. 12. More specifically, FIGS. 19 and 20 are side views of example embodiments of a bellows 1200 and FIG. 21 is a top view of a bellows 1200 in accordance with an embodiment.

As shown in FIGS. 19 and 20 a bellows 1200 can comprise a convoluted body defined by repeating alternating valleys 1202 and peaks 1204 extending between a first and second end 1206, 1208. An open bellows cap 1210 can be disposed at the first end 1206 and a closed bellows cap 1212 can be disposed at the second end 1208. The bellows caps 1210, 1212 can have a maximum diameter that is smaller than a maximum and/or minimum diameter of the convolutions of the bellows 1200.

In various embodiments, a bellows 1200 can be generally cylindrical with a central axis $X_B$ along which the bellows 1200 extends. In various embodiments, the bellows 1200 and portions thereof can have one or more axis of symmetry about central axis $X_B$. For example, in various embodiments, the convolutions of the bellows 1200 can have circular radial symmetry and/or axial symmetry about central axis $X_B$ between the first and second ends 1206, 1208 or at least a portion thereof.

A shown in FIGS. 19-21, the bellows caps 1210, 1212 can comprise flat sidewalls 1211 on one or more sides of the caps 1210, 1212. An example having four flat sidewalls 1211 is shown in FIG. 21, but in further examples, the bellows caps 1210, 1212 can include any suitable number of flat sidewalls, including one, two, three, four, five, ten, twenty, or the like. In various embodiments, the caps 1210, 1212 can be configured to engage with and be held by portions of the top and bottom plates 410, 430. For example, the caps 1210, 1212 can be configured to be respectively coupled within a bottom plate coupling port 415 (see FIGS. 8a and 9a) and a top plate coupling port 431 (see FIGS. 4, 7 and 10).

In some embodiments, the caps 1210, 1212 and coupling ports 415, 431 can be configured to provide a coupling therebetween that resists rotation of the bellows 1200 within the coupling ports 415, 431. For example, the coupling ports 415, 431 can be generally polygonal and/or comprise one or more linear sides and the caps 1210, 1212 can also be generally polygonal and/or comprise one or more linear sides that correspond to the size and shape of the coupling ports 415, 431.

In the embodiment of FIGS. 4, 7 and 10, for example, the top plate coupling ports 431 have four flat sides between rounded portions, which can correspond to the size and shape of the cap 1210 and flat sidewalls 1211 as shown in FIG. 20, for example. Such a correspondence can thereby allow the cap 1210 to extend within a top plate coupling port 431 and resist rotation of the bellows 1200 within the top plate coupling port 431 based at least on engagement of the flat sidewalls 1211 with corresponding flat edges of the coupling port 431.

Similarly, in the embodiment of FIGS. 8a and 9a, the bottom plate coupling ports 415 have four flat sides between rounded portions, which can correspond to the size and shape of the cap 1210 and flat sidewalls 1211 as shown in FIG. 20, for example. Such a correspondence can thereby allow the cap 1210 to extend within a bottom plate coupling port 415 and resist rotation of the bellows 1200 within the bottom plate coupling port 415 based at least on engagement of the flat sidewalls 1211 with corresponding flat edges of the coupling port 415.

Such examples, however, should not be construed to be limiting on the wide variety of coupling structures of an actuator 101 and bellows 1200 that can provide for coupling thereof, which may or may not provide for resistance to rotation of the bellows 1200 in the actuator 101. For example, other embodiments can include other suitable shapes and sizes of caps 1210, 1212 and coupling ports 415, 431. Alternatively, other suitable structures may or may not include one or both of caps 1210, 1212 or coupling ports 415, 431.

For example, in various embodiments, bellows 1200 can include pockets and/or depressions on bellows cap flats 1211. These features can be used for retention of bellows 1200 into top and bottom plates 410, 430 (e.g., to keep bellows caps seated). Such retention features can be incorporated into the bellows 1200, into a plate 410, 420, and/or as a separate part. In one example, such a feature can be molded in the bellows 1200 including a circumferential top cap slot with domed bosses for snap fit. In other examples, such a feature can be cut into a top and/or bottom plate 410, 430, including one or more tangs on mating ports on plates including formed bosses for snap fit. In yet another example, such a feature can comprise a separate part including a circlip, bonded nubs, wire rope lasso, or the like.

In various embodiments, the bellows 1200 and other portions of an actuator 101 can comprise any suitable material including a material configured for rate-dependent stiffening, including non-Newtonian materials. Geometry of a bellows 1200 can be achieved in various suitable ways, including via stamping, which can include beads and/or other stiffening features in the bellow contact patch, extruded material around a bellow cap hole, and the like.

The caps 1210, 1212 of the bellows 1200 can be any suitable shape in various embodiments. For example, in one embodiment, the bellow caps 1210, 1212 can be round which can be desirable for enhancing even material distribution during a molding process and reducing cost in forming of plate mating features.

The bellows 1200 can be made in various suitable ways. For example, in some embodiments, the bellows 1200 can be hydroformed, which can comprise a variation on injection stretch blow molding. Such a process can use the property of a polymer to perform molding at room-temperature at extremely high pressure into a secondary mold to stretch to beyond final dimension (e.g., 600% elongation) and then relax to a final dimension at (e.g., 350% elongation). This can allow a bellows blow mold to have a small stretch ratio while hot, and can improve the material properties of the bellows 1200, which can allow for the same.

Further embodiments can comprise coextrusion, which in one example can use an external layer that is less costly and with higher ultra-violet (UV) resistance as a sacrificial element to increase UV resistance of whole part. Additionally, some embodiments can comprise flexible bellows paint, which can comprise coating the bellows 1200 post-molding to increase UV resistance. In further embodiments, bellows caps 1210, 1212 can be generated during the molding process or can be welded on in a separate step. For example, the convoluted body of the bellows 1200 can be made via a continuous blow molding process like corrugated pipe and the caps 1210, 1212 can be welded on afterwards.

The bellows 1200 can comprise various suitable openings that can allow fluid to be introduced and/or removed from an internal cavity of the hollow bellows 1200. For example, FIG. 19 shows an example of a connector assembly 1214 that comprises a port 1216 of the first cap 1210 and a tube support 1218 that can be disposed with the port 1216. Hose clamps 1220 can couple a fluid hose 1222 to the port 1216 and to an end of a bent connector nozzle 1224. In various examples, the tube support 1218 can be configured to provide compression resistance for the bellows 1200 (e.g., where the bellows 1200 comprises a soft materials), which can be desirable for preventing the connector assembly 1214 from relieving compression and leaking.

FIG. 20 illustrates another example of a connector assembly 1214 that can be coupled to the first cap 1210 in various suitable ways, including adhesive bonding, contact welding, hot tool polymer welding, hot plate welding, spin welding, friction welding, ultrasonic welding, high frequency welding, radio frequency welding, solvent welding, hot gas welding, radiant welding, infrared welding, laser welding, hot wire welding, heat sealing, or the like.

In various embodiments, joining an independently manufactured nozzle can be desirable, because such a configuration can decouple the manufacturing capabilities of the process by which the bellows 1200 and nozzle are made. For instance, by manufacturing the nozzle independently it can be possible to maintain higher tolerances, maintain surface finishes, and include features that are not possible in a bellow manufacturing process. Additionally, it can possible to manufacture the nozzle from a different material with different properties than that of the bellows 1200.

In some examples, a flow restricting orifice can control a fluid flow rate entering the bellows 1200. For example, the nozzle can provides a bore and/or sealing surface where a flow restriction element can be installed. In one embodiment, a set screw orifice with an external threaded surface can be driven into the internal bore of the nozzle. The set screw orifice can have a conical tip which can mate with a sealing surface on the nozzle. The set screw orifice can have a small hole controlling fluid flow rate across the assembly.

In various embodiments the bellows 1200 can be selectively inflated and/or deflated to cause movement of the top plate 430 relative to the bottom plate. Examples of systems and methods for controlling and actuation via bellows 1200 of an actuator 101 are discussed in more detail in the applications incorporated by reference herein.

FIGS. 31a, 31b, 32a and 32b illustrate an example embodiment of a module clamp 3100 in accordance with one embodiment, which can be used to secure photovoltaic modules 103 to a racking system of a solar tracker 100. As shown in this example, the module clamp 3100 can comprise a bolt 3110 that includes a flange head 3111 including serrations 3112 which can be configured to break anodization of modules to enable electric bonding. In some examples, the bolt 3110 can comprise a standard bolt with a sheet metal top cap, or with a captive washer.

The module clamp 3100 can also include a clamp head 3120, which in some examples can comprise a formed sheet metal clamp (e.g., made of steel, extruded aluminum, die cast aluminum, or the like). Various examples of the clamp head 3120 can comprise sharp edges to pierce anodization. Some examples can include a tab to keep equal spacing between modules. Some examples can include a cinch nut. Some examples can include a female thread, rolled threads, a rivet nut, or any other captive nut.

The described embodiments are susceptible to various modifications and alternative forms, and specific examples thereof have been shown by way of example in the drawings and are herein described in detail. It should be understood, however, that the described embodiments are not to be limited to the particular forms or methods disclosed, but to the contrary, the present disclosure is to cover all modifications, equivalents, and alternatives.

It should be noted that the figures are not drawn to scale and that elements of similar structures or functions are generally represented by like reference numerals for illustrative purposes throughout the figures. It also should be noted that the figures are only intended to facilitate the description of the preferred embodiments. The figures do not illustrate every aspect of the described embodiments and do not limit the scope of the present disclosure.

What is claimed is:

1. An actuator comprising:
   a bottom plate;
   a top-plate;
   a first and second hub assembly extending between the bottom and top plates, wherein the first and second hub assembly each comprise a plurality of stacked hub units, the hub units each including first and second hub arms and wherein first and second hub arms of the hub units of the hub assemblies are disposed relative to each other at respective angles θ within a range of 180° and 90° and wherein the respective angles θ of the stacked hub units of a hub assembly successively increase in along a length of the stack of hub units;
   a first and second bellows disposed on opposing sides of the hub assemblies, the first and second bellows each extending between and coupled to the top plate and bottom plate; and
   a plurality of washers disposed between the top and bottom plates, with each of the washers coupled to the first and second hub assembly, a first set of the plurality of washers surrounding the first bellows and a second set of the plurality of washers surrounding the second bellows.

2. The actuator of claim 1, further comprising a first and second flexure that each extend between and are coupled to the top and bottom plates, the first flexure extending through the first hub assembly and the second flexure extending through the second hub assembly.

3. The actuator of claim 1, wherein the first and second hub assembly extend between the bottom and top plates on opposing sides of the actuator.

4. The actuator of claim 1, wherein the first set of washers are coupled to the first hub arms of the first and second hub assemblies, wherein the second set of washers are coupled to the second hub arms of the first and second hub assemblies.

5. The actuator of claim 1, wherein the actuator is configured to move the top plate relative to the bottom plate by inflation of the first and second bellows.

6. The actuator of claim 1, wherein the actuator is configured to assume a configuration wherein the actuator has a central plane of symmetry that extends through the hub assemblies, with the first and second bellows on opposing sides of the plane of symmetry, and with the first and second sets of washers on opposing sides of the plane of symmetry.

7. The actuator of claim 1, wherein the washers each respectively comprise inner and outer washer components, the inner and outer washer components overlapping each other and bound together and coupled with a hub assembly via fasteners.

8. The actuator of claim 1, wherein the first and second bellows respectively define first and second ends, and wherein the top plate defines a pair of top plate coupling ports with the respective first ends of the first and second bellows coupled within the respective top plate coupling ports.

9. The actuator of claim 1, wherein the first and second bellows respectively define first and second ends, and wherein the bottom plate defines a pair of bottom plate coupling ports with the respective second ends of the first and second bellows coupled within the respective bottom plate coupling ports.

* * * * *